US011099237B2

(12) United States Patent
Nochilur et al.

(10) Patent No.: US 11,099,237 B2
(45) Date of Patent: Aug. 24, 2021

(54) TEST PRIORITIZATION AND DYNAMIC TEST CASE SEQUENCING

(71) Applicant: Accenture Global Solutions Limited, Dublin (IE)

(72) Inventors: Sunder Ranganathan Nochilur, Karnataka (IN); Mahesh Venkataraman, Bangalore (IN); Kulkarni Girish, Bangalore (IN); Mallika Fernandes, Bangalore (IN); Jothi Gouthaman, Chennai (IN); Venugopal S. Shenoy, Bangalore (IN); Kishore P. Durg, Bangalore (IN)

(73) Assignee: Accenture Global Solutions Limited, Dublin (IE)

( * ) Notice: Subject to any disclaimer, the term of this patent is extended or adjusted under 35 U.S.C. 154(b) by 0 days.

(21) Appl. No.: 16/749,775

(22) Filed: Jan. 22, 2020

(65) Prior Publication Data

US 2020/0158780 A1   May 21, 2020

Related U.S. Application Data

(63) Continuation of application No. 16/209,103, filed on Dec. 4, 2018, now Pat. No. 10,578,673.

(30) Foreign Application Priority Data

Dec. 27, 2017 (IN) .................. 201711046829 PRV
Mar. 5, 2018 (IN) .......................... 201711046829
Mar. 16, 2018 (IN) .......................... 201814009794

(51) Int. Cl.
*G06F 9/44* (2018.01)
*G01R 31/3183* (2006.01)
(Continued)

(52) U.S. Cl.
CPC ......... *G01R 31/31835* (2013.01); *G06F 8/10* (2013.01); *G06F 11/008* (2013.01);
(Continued)

(58) Field of Classification Search
CPC ............. G06F 11/3688; G06F 11/3616; G06F 11/3676; G06F 11/3664; G06F 11/008;
(Continued)

(56) References Cited

U.S. PATENT DOCUMENTS 7,961,955 B1 * 6/2011 Minter ................. G06K 9/6259
382/224
8,417,715 B1 * 4/2013 Bruckhaus ......... G06Q 30/0202
707/758
(Continued)

FOREIGN PATENT DOCUMENTS

WO    WO 2011/041672    4/2011

OTHER PUBLICATIONS

Nan et al, "Clustering of Defect Reporsts Using Graph Partitioning Algorithms", ResarchGate, Jan. 2009, pp. 1-4 <graph_clustering.pdf>.*
(Continued)

*Primary Examiner* — Tuan A Vu
(74) *Attorney, Agent, or Firm* — Fish & Richardson P.C.

(57) ABSTRACT

Methods, systems, and apparatus, including computer programs encoded on a computer storage medium, for a touchless testing platform employed to, for example, create automated testing scripts, sequence test cases, and implement defect solutions. In one aspect, a method includes receiving a log file and testing results generated from a code base for an application; processing the log file through a pattern-mining algorithm to determine a usage pattern of code modules within the code base; clustering defects from the testing results based on a respective functionality of the
(Continued)

application reported within each of the defects; generating testing prioritizations for test cases for the application by assigning weightages to the test cases based on the clusters of defects and the usage pattern of the code modules within the code base; sequencing a set of the test cases based on the test prioritizations; and transmitting the sequence to a test execution engine.

20 Claims, 16 Drawing Sheets

(51) Int. Cl.
    *G06F 11/36*     (2006.01)
    *G06N 20/00*     (2019.01)
    *G06F 15/76*     (2006.01)
    *G06F 16/901*     (2019.01)
    *G06F 8/10*     (2018.01)
    *G06N 5/02*     (2006.01)
    *G06F 11/00*     (2006.01)
    *G06F 11/34*     (2006.01)
    *G05B 23/02*     (2006.01)

(52) U.S. Cl.
    CPC ...... *G06F 11/3438* (2013.01); *G06F 11/3476* (2013.01); *G06F 11/3616* (2013.01); *G06F 11/3664* (2013.01); *G06F 11/3676* (2013.01); *G06F 11/3684* (2013.01); *G06F 11/3688* (2013.01); *G06F 11/3692* (2013.01); *G06F 11/3696* (2013.01); *G06F 15/76* (2013.01); *G06F 16/9024* (2019.01); *G06N 5/02* (2013.01); *G06N 20/00* (2019.01); *G05B 23/0229* (2013.01); *G06F 2201/865* (2013.01)

(58) Field of Classification Search
    CPC ............. G06F 11/3438; G06F 11/3476; G06F 11/3684; G06F 11/3692; G06F 11/3696; G06F 8/10; G06F 15/76; G06F 16/9024; G06F 2001/865; G01R 31/2837; G01R 31/2894; G01R 31/31835; G06Q 30/0202; G06K 9/6259; G06N 20/00; G06N 5/02; G05B 23/0229
    See application file for complete search history.

(56) References Cited

U.S. PATENT DOCUMENTS

| | | | |
|---|---|---|---|
| 9,021,440 B1 | 4/2015 | Chandrasekaran | |
| 9,032,360 B1 | 5/2015 | Cohen et al. | |
| 9,047,414 B1 | 6/2015 | Matyjek | |
| 9,495,642 B1 | 11/2016 | Smith | |
| 10,073,763 B1 | 9/2018 | Raman et al. | |
| 10,114,738 B2 | 10/2018 | Dsouza | |
| 10,318,882 B2 | 6/2019 | Brueckner | |
| 10,430,323 B2 | 10/2019 | Raman et al. | |
| 10,642,721 B2 | 5/2020 | Kulkarni et al. | |
| 2004/0153819 A1* | 8/2004 | Bjorsne | G01R 31/2837 714/37 |
| 2005/0102596 A1 | 5/2005 | Hekmatpour | |
| 2006/0053357 A1* | 3/2006 | Rajski | G01R 31/2894 714/742 |
| 2006/0156287 A1 | 7/2006 | Vikram | |
| 2007/0156379 A1 | 7/2007 | Kulkarni | |
| 2009/0013307 A1 | 1/2009 | Raghavan | |
| 2011/0246881 A1 | 10/2011 | Kushman | |
| 2012/0197595 A1 | 8/2012 | Gouthannan et al. | |
| 2012/0266023 A1 | 10/2012 | Brown | |
| 2013/0074051 A1 | 3/2013 | Freeman et al. | |
| 2013/0097586 A1 | 4/2013 | Chandra et al. | |
| 2014/0013164 A1* | 1/2014 | Ma | G06F 11/3688 714/38.1 |
| 2014/0380280 A1 | 12/2014 | Millwood | |
| 2015/0081614 A1 | 3/2015 | Bechet et al. | |
| 2015/0082277 A1 | 3/2015 | Champlin-Scharff et al. | |
| 2015/0227452 A1 | 8/2015 | Raghavan | |
| 2015/0254165 A1 | 9/2015 | Baril et al. | |
| 2015/0378873 A1 | 12/2015 | Prasad et al. | |
| 2015/0379072 A1 | 12/2015 | Dirac | |
| 2015/0379429 A1 | 12/2015 | Lee | |
| 2016/0011960 A1 | 1/2016 | Krishna et al. | |
| 2016/0011963 A1 | 1/2016 | Krishna et al. | |
| 2016/0077956 A1 | 3/2016 | Bhattacharya et al. | |
| 2016/0217062 A1 | 7/2016 | Singi | |
| 2017/0004064 A1 | 1/2017 | Rufai | |
| 2017/0046245 A1* | 2/2017 | Liu | G06F 11/3688 |
| 2017/0212829 A1 | 7/2017 | Bales | |
| 2017/0344467 A1 | 11/2017 | Yadav et al. | |
| 2018/0011780 A1 | 1/2018 | Aggarwal | |
| 2018/0069967 A1 | 3/2018 | Mandry | |
| 2018/0121317 A1* | 5/2018 | Ekambaram | G06F 11/3616 |
| 2018/0373620 A1 | 12/2018 | Thomson | |
| 2019/0065357 A1 | 2/2019 | Brafinan | |
| 2019/0196949 A1 | 6/2019 | Venkataraman et al. | |
| 2019/0213116 A1 | 7/2019 | Kulkarni et al. | |
| 2019/0370160 A1 | 12/2019 | Raman et al. | |

OTHER PUBLICATIONS

Hirzel et al, "Prioritizing Regression Tests for Desktop and Web-Applications based on the Execution Frequency of Modified Code", PPPJ 16, Sep. 2016, pp. 12 <Prioritizing_Hirzel.pdf>.*
Fang et al, "Similarity-based test case prioritization using ordered sequences of program entities", Nanjing Software Technology , Nov. 2013 pp. 27 <similarity_Fang.pdf>.*
IN Office Action in Indian Appln. No. 201814009794, dated Nov. 23, 2020, 7 pages.
Chen et. al, "Usage-pattern Based Statistical Web Testing and Reliability Measurement," ScienceDirect Procedia Computer, Science 21 (2013), 140-147.
EP Extended European Search Report in European Appln. No. EP 19150223.6, dated Jun. 6, 2019, 9 pages.
EP Search Report in European Appln. No. EP 18208043.2, dated May 23, 2019, 7 pages.
EP Search Report in European Appln. No. EP 19150223, dated Jun. 6, 2019, 9 pages.
EP Search Report in European Appln. No. EP18208043, dated May 23, 2019, 7 pages.
Singh, "What is Gherkin and How to Write Gherkin Test in Cucumber", Dec. 31, 2014, retrieved on May 6, 2020, retrieved from URL<https://www.toolsqa.com/cucumber/gherkin/>, 6 pages.
Upadhyah, "Prioritizing Test Suites using Clustering Approach in Software Testing", International Journal of Soft Computing and Engineering, 2(4):222-226, Sep. 2012.
Zhu et al. "A test automation solution on GUI functional test" The IEEE International Conference on Industrial Informatics, Jul. 2008, pp. 1413-1418.

* cited by examiner

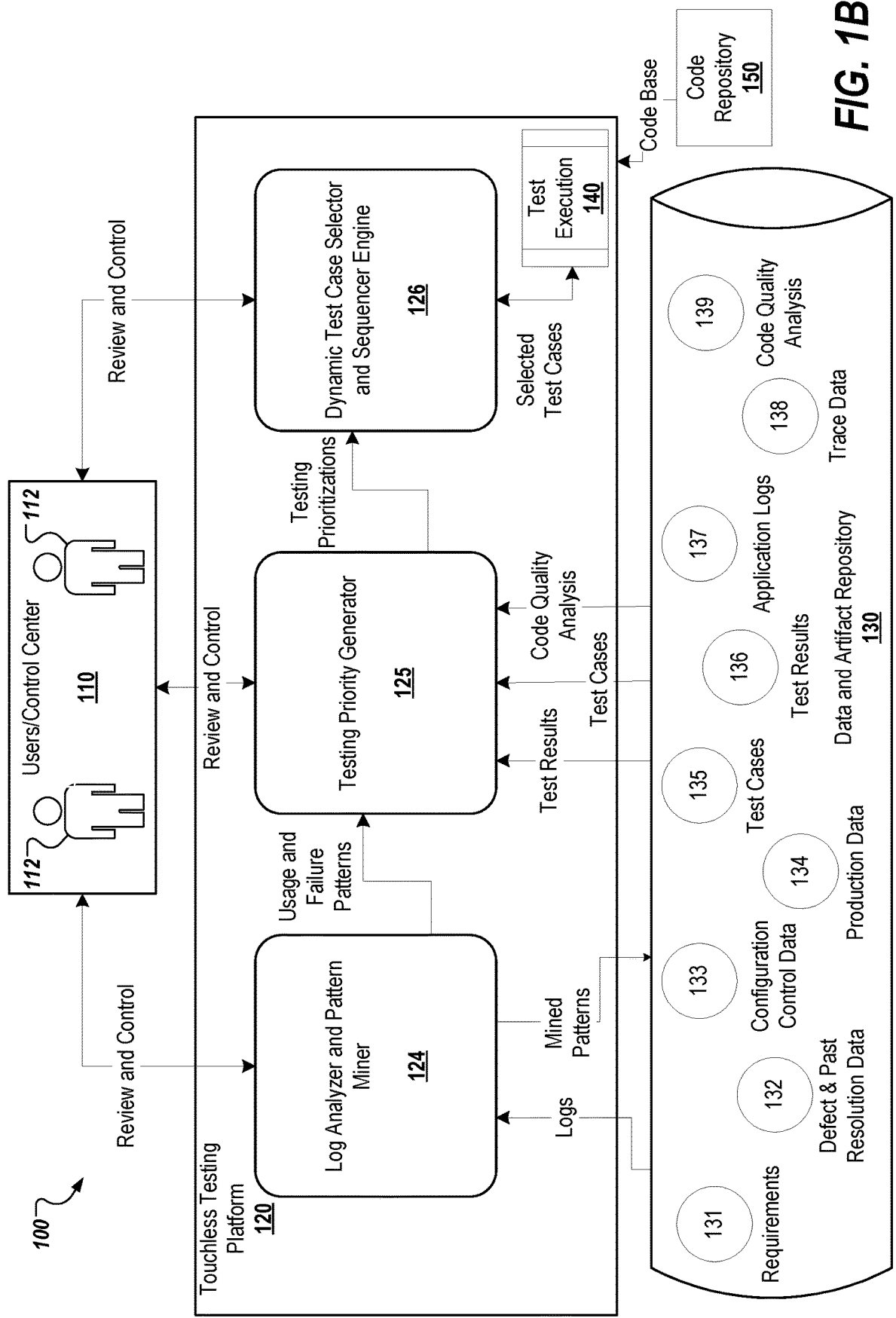

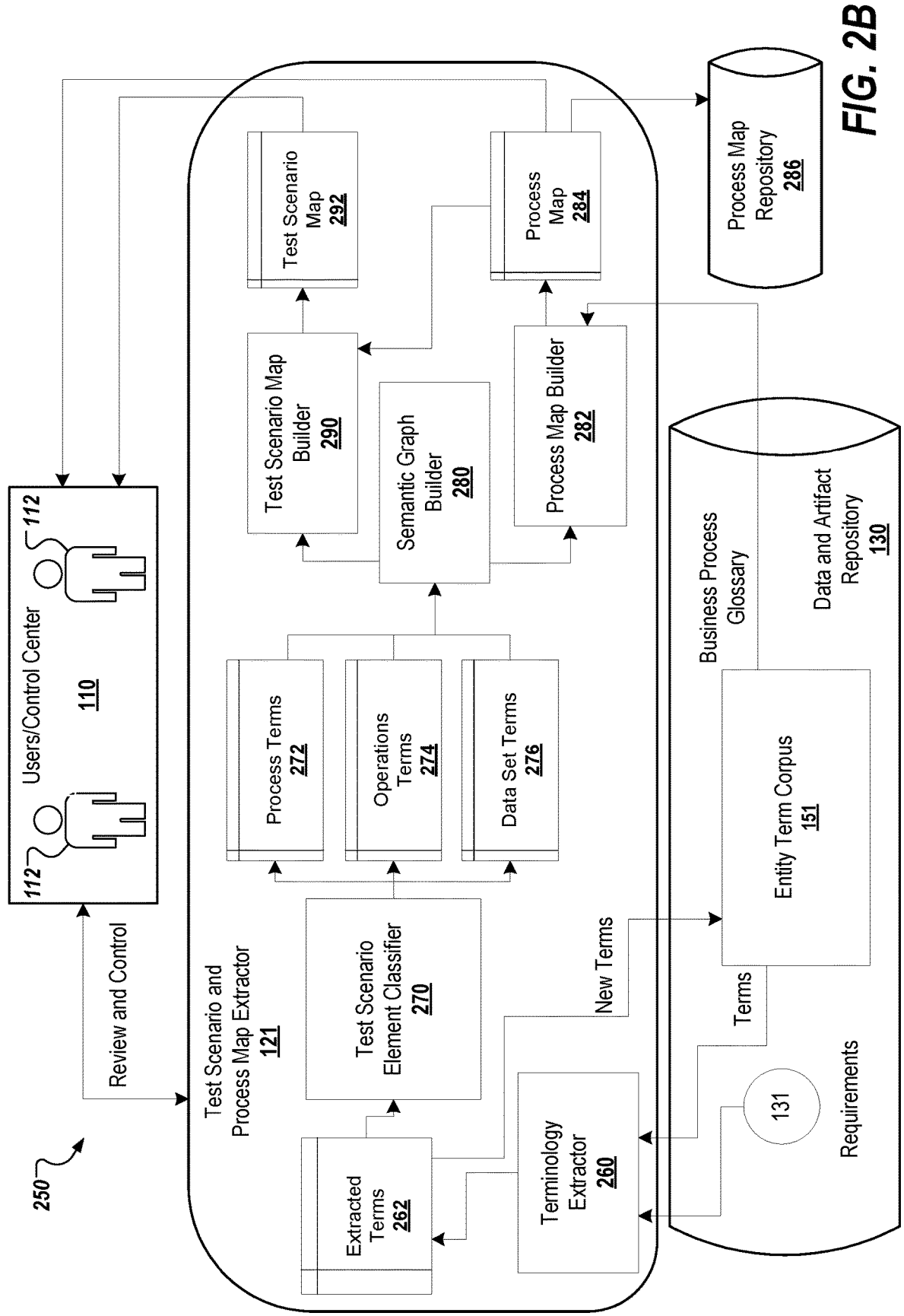

TEST PRIORITIZATION AND DYNAMIC TEST CASE SEQUENCING

CROSS-REFERENCE TO RELATED APPLICATIONS

This application is a continuation of U.S. application Ser. No. 16/209,103, filed Dec. 4, 2018, now allowed, which claims priority to Indian Patent Application No. 201814009794, filed on Mar. 16, 2018, Indian Patent Application No. 201711046829, filed Mar. 5, 2018, and Indian Provisional Application No. 201711046829 PRV, filed Dec. 27, 2017. All of these prior applications are incorporated by reference in their entirety.

TECHNICAL FIELD

This application generally relates to generating and executing automated testing scripts.

BACKGROUND

Software applications are designed to accommodate a multitude of transactions, where each transaction often requires the performance of a significant number of functions. Testing of software applications may include creating test cases based on requirements and then executing the test cases through, for example, a test script to detect defects. Test cases may be automated using commercial and open source tools to reduce execution time. For example, a regression test suite is a set of test cases, often written in the form of a script, designed to ensure that each of these functions remain accurate and correct following modification of the underlying programming code. Execution of these suites helps to ensure that defects have not been introduced or uncovered in unchanged areas of the codebase as a result of the modification. Moreover, each level of testing (e.g., unit testing, system testing, and acceptance testing) may have its own regression test suite. Providers of these software applications and/or their corresponding services are faced with the problem of having large regression test suites that are executed manually and the need to automate these test suites to function within any one of a number of industry standard automation tools. Once automated, these test cases can be executed repeatedly and frequently, which adds to the amount of testing coverage for the respective application. However, effective and efficient management of such suites of test cases is both time consuming and effort intensive.

SUMMARY

Implementations of the present disclosure are generally directed to a touchless automated platform system. More specifically, implementations are directed to a system that creates automated testing scripts based on test cases determined according to requirements documentation, sequences the test cases for execution, and implements defect solutions determined according to the specific application functionalities involved.

In a general implementation, a system includes one or more processors; and a computer-readable storage device coupled to the one or more processors and having instructions stored thereon which, when executed by the one or more processors, cause the one or more processors to perform operations that include: receiving a log file and testing results generated from a code base for an application; processing the log file through a pattern-mining algorithm to determine a usage pattern of code modules within the code base; clustering defects from the testing results based on a respective functionality of the application reported within each of the defects; generating testing prioritizations for test cases for the application by assigning weightages to the test cases based on the clusters of defects and the usage pattern of the code modules within the code base; sequencing a set of the test cases based on the test prioritizations; and transmitting the sequenced set of test cases to a test execution engine.

In another general implementation, a computer-implemented method executed by one or more processors includes: receiving a log file and testing results generated from a code base for an application; processing the log file through a pattern-mining algorithm to determine a usage pattern of code modules within the code base; clustering defects from the testing results based on a respective functionality of the application reported within each of the defects; generating testing prioritizations for test cases for the application by assigning weightages to the test cases based on the clusters of defects and the usage pattern of the code modules within the code base; sequencing a set of the test cases based on the test prioritizations; and transmitting the sequenced set of test cases to a test execution engine.

In yet another general implementation, one or more non-transitory computer-readable storage media coupled to one or more processors and having instructions stored thereon which, when executed by the one or more processors, cause the one or more processors to perform operations that include: receiving a log file and testing results generated from a code base for an application; processing the log file through a pattern-mining algorithm to determine a usage pattern of code modules within the code base; clustering defects from the testing results based on a respective functionality of the application reported within each of the defects; generating testing prioritizations for test cases for the application by assigning weightages to the test cases based on the clusters of defects and the usage pattern of the code modules within the code base; sequencing a set of the test cases based on the test prioritizations; and transmitting the sequenced set of test cases to a test execution engine.

In an aspect combinable with any of the general implementations, the operations further include before generating the testing prioritization, determining lines of code that are exercised by each of the test cases, wherein the weightages to the test cases are assigned based on the respective lines of code that are exercised.

In another aspect combinable with any of the previous aspects, the operations further include before generating the testing prioritization, determining user behaviors on the application based on an analysis of the log file, wherein the weightages are assigned based on the respective test case mimicking the determined user behaviors.

In another aspect combinable with any of the previous aspects, the operations further include before generating the testing prioritization, processing the testing results to determine an effectiveness metric for each test case, wherein the effectiveness metric indicates an effectiveness of a test case for defect discovery, wherein the weightages to the test cases are assigned based on the effectiveness metric.

In another aspect combinable with any of the previous aspects, the operations further include before generating the testing prioritization, clustering the test cases based on a functionality tested and at least one of the code modules that is exercised by the test case; and mapping the clusters of defects to the to the clusters of test cases to determine test coverage for the code base, wherein the weightages to the test cases are assigned based on the mapping and according to the test coverage.

In another aspect combinable with any of the previous aspects, the operations further include identifying gaps in test coverage based on the mapping and the determined test coverage.

In another aspect combinable with any of the previous aspects, the operations further include generating, based on the usage pattern, a representation of code module execution, a distribution of data across service types, or test case utilization based on actual usages in production.

In another aspect combinable with any of the previous aspects, the operations further include determining churn data based on an analysis of configuration and coding changes to the code base; processing testing results, the churn data, and the code base through an Artificial Intelligence (AI) model, the AI model being trained using training data comprising resolutions to the defects in the code base; and determining a likelihood of failure for functionalities of the code base, wherein the weightages to the test cases are based on the likelihood of failure for the functionalities of the code base.

In another aspect combinable with any of the previous aspects, the operations further include determining a resolution for a defect reported based on a result of an execution a testing script assigned to one of the sequenced set of test cases; and implementing the resolution in the code base.

In another aspect combinable with any of the previous aspects, the operations further include before generating the testing prioritization, determining lines of code that are exercised by each of the test cases, wherein the weightages to the test cases are assigned based on the respective lines of code that are exercised, and wherein the lines of code exercised by each test case are determined based on execution data from an execution of the test cases against the application captured by an agent installed on an application server that is running the application.

In another aspect combinable with any of the previous aspects, the operations further include before generating the testing prioritization, processing the testing results to determine an effectiveness metric for each test case, wherein the effectiveness metric indicates an effectiveness of a test case for defect discovery, wherein the weightages to the test cases are assigned based on the effectiveness metric.

In another aspect combinable with any of the previous aspects, the operations further include before generating the testing prioritization, clustering the test cases based on a functionality tested and at least one of the code modules that is exercised by the test case; mapping the clusters of defects to the to the clusters of test cases to determine test coverage for the code base, wherein the weightages to the test cases are assigned based on the mapping and according to the test coverage; and identifying gaps in test coverage based on the mapping and the determined test coverage.

Another aspect combinable with any of the previous aspects, the testing prioritizations include a prioritization for each test case, wherein the weightages are assigned to each test case according to the usage pattern of the respective functionality or code module tested and the associated cluster of defects.

In another aspect combinable with any of the previous aspects, the lines of code exercised by each test case are determined based on execution data from an execution of the test cases against the application captured by an agent installed on an application server that is running the application.

In another aspect combinable with any of the previous aspects, the usage pattern includes sequences that code modules were executed and a frequency that each of the sequences were executed.

It is appreciated that methods in accordance with the present disclosure can include any combination of the aspects and features described herein. That is, methods in accordance with the present disclosure are not limited to the combinations of aspects and features specifically described herein, but also may include any combination of the aspects and features provided.

The details of one or more implementations of the present disclosure are set forth in the accompanying drawings and the description below. Other features and advantages of the present disclosure will be apparent from the description and drawings, and from the claims.

BRIEF DESCRIPTION OF DRAWINGS

FIGS. 1A-1C depict an example touchless testing platform system.

FIGS. 2A and 2B depict example implementations of the test scenario and process map extractor engine.

DETAILED DESCRIPTION

Figure 1A:
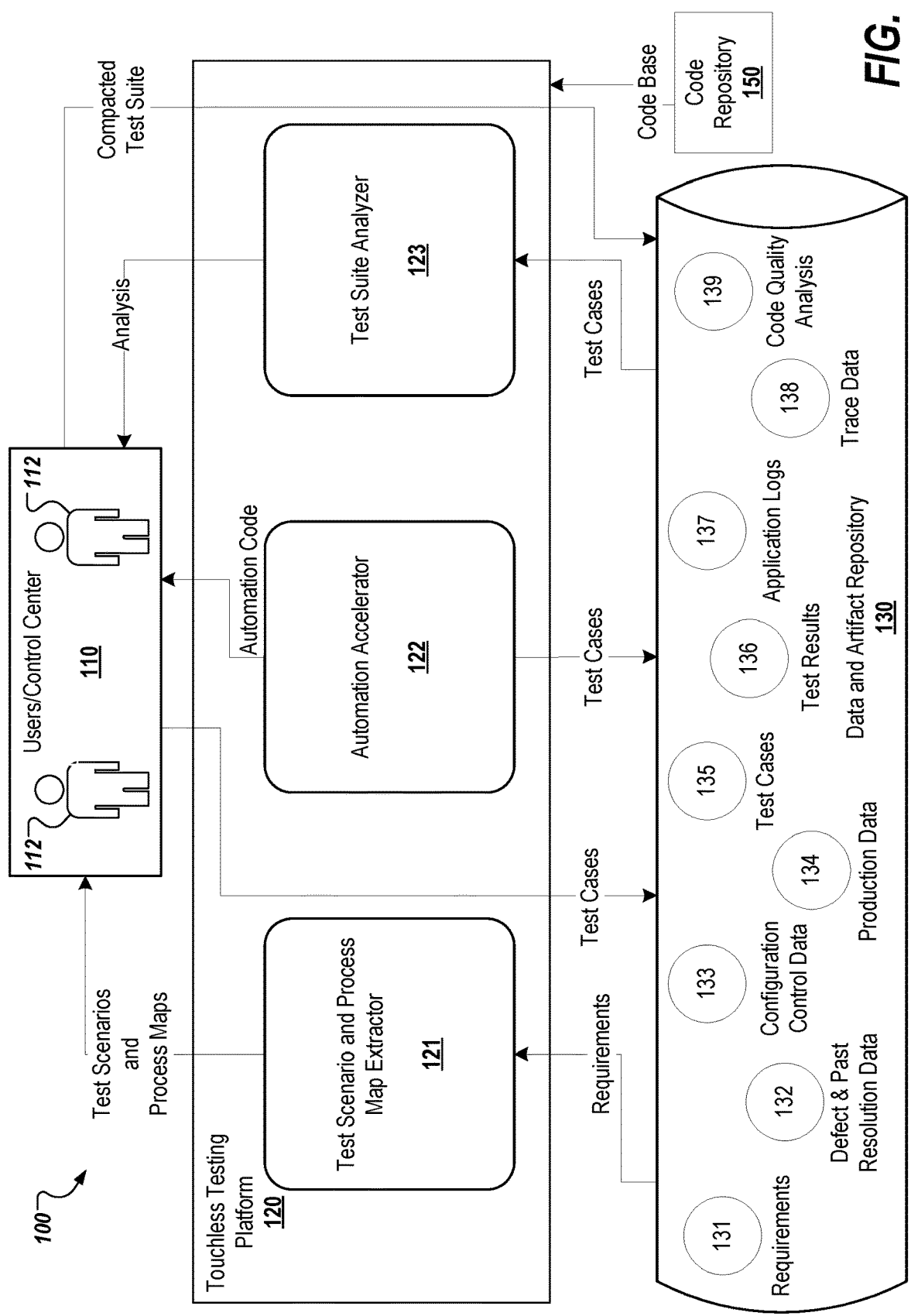

Application and system testing includes a defined set of activities pertaining to test case design, execution, and defect reporting. With increasing complexity of information technology (IT) architectures, increasing adoption of agile and DevOps, and quicker speed to market, testing practice expectations for overall performance and efficiency of product releases is increased. Thus, testing methodologies to assure the go-live readiness in the shortest possible time of systems and application for release as well as improvements in the quality, stability, and reliability of these methodologies is beneficial. Accordingly, a need exists for widening the mandate for testing as well as employing new strategies and techniques within the creation, maintenance, and execution of regression suites. For example, methodologies may be employed to create test cases based on a set of criteria, such as maximizing testing coverage. The methodologies may meet the criteria by, for example, increasing automation and efficient reporting of discovered defects. Accordingly, a robust testing platform embraces speed and data driven intelligence, which enable users to effectively and agility produce quality results.

In view of the foregoing, implementations of the present disclosure are generally directed to a touchless testing platform system for creating automated testing scripts, sequencing test cases, and implementing defect solutions. The described system employs techniques, such as data mining, artificial intelligence, machine learning, and natural language processing, to build and maintain enterprise testing suites. Beginning with requirements documentation, the described system generates test scenarios, which are used to create test cases once the application or system has been built. Requirements documentation (e.g., business requirements, functional requirements, use cases, user stories, and so forth) captures, for example, information related to the business process(es) that will be supported by the software, intended actions that will be performed through the software, managed data, rule sets, nonfunctional attributes (e.g., response time, accessibility, access and privilege), and so forth. Using this documentation, the described system can be employed to extract key processes and events, feature requirements, non-functional testing, and so forth through, for example, name entity recognition, topic segmentation, part-of-speech tagging, terminology and relationship extraction techniques, semantic clustering, and test case mind maps, which may be generated by employing, for example, semantic graphs. Based on this extracted information, test scenarios are generated. Test scenarios explain, for example, a general process without focusing on implementation. Once the design of the software is available, the test scenarios can be converted into test cases specific to the implementation of the respective business requirement(s).

The described system provides benefits to test designers by quickly identifying the key attributes to be tested as well as their operations and relationships, thus significantly improving the productivity and quality of test cases. For example, natural language processing (NLP) and clustering techniques can be employed to extract the intent from a test case and automatically create code. As an example, logging into an application or program, such as a web application, may require a user name and password or completing a particular form in a web application with a certain set of information. The described system may correlate the intent of use with an object(s) on a selected page or screen of the web application. Once the intent and objects are correlated, the system selects a template(s) corresponding to a designated automation tool to generate the automated testing script for the determined test scenarios. Once a test scenario has been translated to an automated testing script, the test scenarios can be tested frequently and used in a variety of testing processes using the respective automated testing script.

Furthermore, testing automation may realize 'unattended testing' through a robust automation framework that provides for better coding practices, such as improved exception handling; portability across environments and applications; and the integration of test data and deployment environments into the automation logic. In some examples, test scripts fail not because of a system failure, but due to environment failure and/or incorrect test data. Accordingly, the described system provides an orchestrator process to provide for the oversight of end-to-end execution of regression suites. For example, the described system may generate alerts on failures that are due to the test environment and/or the particular data used to test the functionality of the particular application or system being tested. These processes can also collect system logs and traces when a failure is encountered.

While it is important for the testing process to maximize coverage of system requirements, the described system includes robust and optimized testing processes that search and discover defects. For example, one objective of testing optimization is to maximize defect yield in relation to the amount of cost (e.g., time) spent on testing. The described system optimizes testing by employing AI and NLP techniques to, for example, remove duplicate test cases and/or test cases exercising the same execution paths. NLP can be described as the ability of a computer program or software to understand human speech as it is spoken or written. NLP makes it possible for an AI program to receive conversational or text input by breaking the respective syntax down to determine the input's meaning and/or determine an appropriate action.

Additionally, the described system optimizes testing by improving the maintainability and re-use of regression suites by identifying re-useable components, such as test step and test cases that can be executed through other test cases.

Furthermore, graphical representations, such as heat maps, may be created and employed for a quantitative analysis and selection of a set of test cases to execute. For example, a heat map may be created by determining system usage and failure patterns that may be extracted from production logs where functionalities that have a higher usage and/or a higher propensity to fail may indicate a condition for increased test priority. Heat maps may also be used to determine functionalities where change is occurring at an increased rate. These types of factors may also indicate a condition for increased test priority. Additionally, the code bases to be tested may be analyzed to set testing priorities based on a determined quality of various modules within the code based.

The described system also provides processes for dynamic test sequencing. These processes select test cases to be executed based on test priority, which may be determined according to the generated graphical representations. In some implementations, the order of test case execution or test sequencing is dynamically determined to maximize various thresholds or criteria, such as defect yield per test case executed. This can be done by, for example, clustering test cases based on machine-learning algorithms that are trained according to previous execution results.

The described system provides processes to increase test case vitality. The vitality of a test case includes its ability to activate fault chains, trigger failures, and/or detect defects. For example, the longer a test case is in use, the more its vitality decreases due to factors, such as inadequate coverage of failure paths or improvements to the functionality that is covered by the test case. The described system also includes processes that conducted test vitality analysis to, for example, remove test cases exhibiting poor vitality, thus improving defect yield per unit test case executed.

The described system also integrates functional and non-functional testing as a testing failure may happen due to functional and/or non-functional root causes. For example, a functional defect may originate from non-functional causes, such as a database timeout leading to an incorrect update on a user interface (UI). In such an example, testers may tag the UI issue as a functional defect. To provide for this integration, the described system includes processes that analyze performance, scalability, stability, recoverability, exception handling, upgrade, and so forth, which are executed throughout the testing cycle and/or in parallel. Furthermore, the described system uses application monitoring and log mining to build useful insights into the underlying architecture behavior as functional tests are being run. For example, thresholds for known problem patterns and monitor alerts may be set and machine learning employed to determine typical system behavior as well as search for anomalies.

The described system also includes processes that continuously build data driven insights throughout the tested systems lifecycle. These insights allow for the implementation of both corrective and prevention actions to achieve projects goals. Insights may include usage patterns, such as how a system is being used, UI pathways being exercised most often, and the control and data flow pathways that are most prevalent; failure prediction and modeling, such as the system components most likely to fail, the most likely pathways that activate internal fault chains and trigger failures, typical system and run time behavior mining and anomaly detection, and anomalies that are prognostic of failures; churn patterns, such as the modules that are undergoing that most churn, from where/who a change(s) is originating, the modules undergoing burst changes; code and architectural quality, such as whether churn is affecting code and/or architectural quality; defect analysis, such as the likely root causes of defects; and fault chain relationships, such as defects causally relationships to one another, root defects versus symptoms, and duplicates.

Figure 1C:
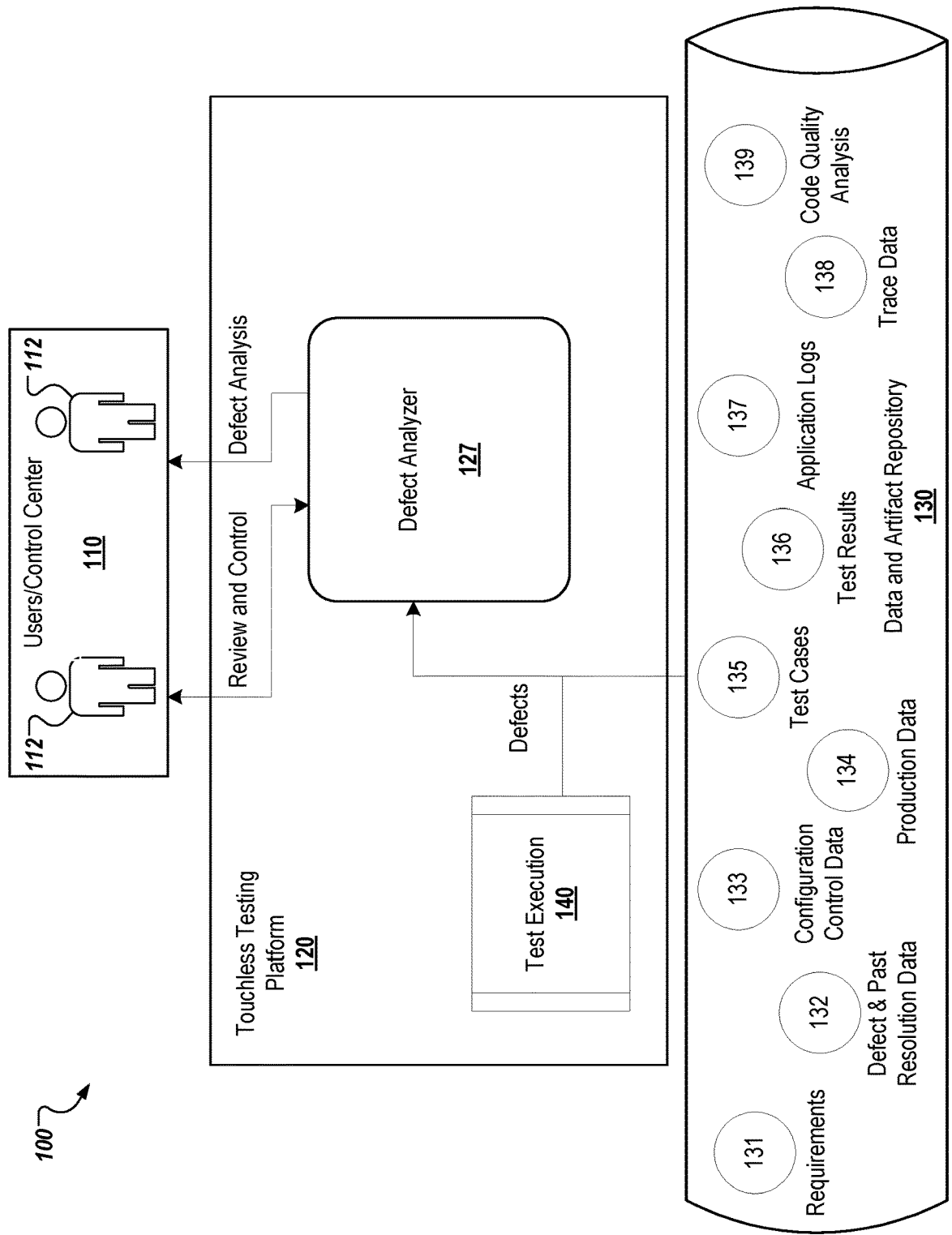

FIGS. 1A-1C depict an example touchless testing platform system 100. The example system 100 includes a control center 110, a touchless testing platform module 120, a data and artifact repository 130 and code repository 150. In the depicted example, the example touchless testing platform system 100 may be deployed to any special purpose computer system. The example system may be provided using one or more computing device(s) of any suitable number and type of computing device. Configuration of such computing devices include shared, virtual, managed/dedicated, cluster/grid, cloud based resources, and/or any combination thereof.

The system 100 provides accesses to the users 112 through the control center 110, which may be accessed over a network (not shown). In the depicted system 100, a user 112 may analyze requirements for an application or system and then design, develop, and test software by applying the theories and principles of computer science and mathematical analysis. The control center 110 includes a series of screens, which may be received and viewed on a user device using, for example, a web browser program. Pages may be generated on a server or virtual server and transmitted via a network. The control center 110 allows the user(s) 112 to provide testing scenarios (e.g., test cases) and control commands to the various modules, which are described in detail below, included in the testing platform module 120 and to the data and artifact repository 130. The control center 110 also allows the user(s) 112 to analysis and view testing results.

The data and artifact repository 130 may be a relational database, such as Oracle or DB2, implemented on an enterprise database server or virtual server. The data and artifact repository 130 may store testing data, such as system requirements 131, which include requirements for the application or system that is being tested; defect and past resolution data 132, which includes defects reported and the respective resolution(s); configuration and control data 133, which includes configurations for the tested application or systems; production data 134, which includes data from the production or other deployment environments for the tested system or application; test cases 135, which include test cases for the function features of the tested application or system; test results 136, which include the results of the regression suites and various test scripts; application logs 137, which include logs from the various deployment environments for the tested application or system; trace data 138, which includes information about the tested application or system's execution; and code quality analysis data 139, which includes results of quality analysis for the tested application or system. These various types of testing data 131-139 are provided as examples. Other types of testing data may be stored in the data and artifact repository 130 and used by the control center 110 and/or the testing platform module 120.

The code repository 150 is a central file storage location that is used by, for example, a version control systems to store multiple versions of files. The code repository 150 may be implemented a local machine, on a server within a data center or through a virtual machine, or through cloud based services. The code repository 150 provides access and storage for users 112 to the code base for the application. The touchless testing platform system 100 may pull various elements and files from the application code base to assist in the generation of test scripts and/or the analysis if test case, testing results and defects. More information regarding how the code repository 150 and the stored application code base is used by the touchless testing platform system 100 is provided below in the description of the various engines and modules.

The testing platform module 120 includes test scenario and process map extractor engine 121, automation accelerator engine 122, test suite analyzer engine 123, log analyzer and pattern miner engine 124, testing priority generator engine 125, dynamic test case selector and sequencer engine 126, and defect analyzer engine 127. The testing platform module 120 achieves a seamless automated workflow of a testing lifecycle guided by data driven intelligence. This data driven intelligence is achieved by AI and machine-learning techniques that accelerate the automation of the activities and the decision-making at various stages of testing. The testing platform module 120 integrates these modules as well as third party and open source tools.

The test scenario and process map extractor engine 121 scans the requirements document and creates the high-level test scenarios and process maps. The automation accelerator engine 122 analyzes manual test cases, extracts the intent, and converts the intent into executable automated scripts. The test suite analyzer engine 123 analyzes test suites and groups contextually similar test cases into clusters based on contextual distance. The log analyzer and pattern miner engine 124 ingests the log files from deployment environments, such as the production or test environment, and extracts various insights, such as usage and/or failure patterns, typical system behaviors, and/or anomalies (which in turn can be used as early warning of potential failures). The testing priority generator engine 125 generates testing prioritizations, which may include graphical representations, such as heat maps, that depict the test priority of various functionalities, code modules, test cases, test suites, and so forth. The testing prioritizations may be generated based on usage patterns, code coverage, failure patterns, module churn, code quality analysis, or a combination thereof. The dynamic test case selector and sequencer engine 126 selects and sequences a set of test cases to be executed based on a configurable criterion and the received testing prioritizations. The defect analyzer engine 127 analyzes defect data and provides data driven insights. Each of these engines are described in detail below with regard to FIGS. 2A-9B.

Figure 2A:
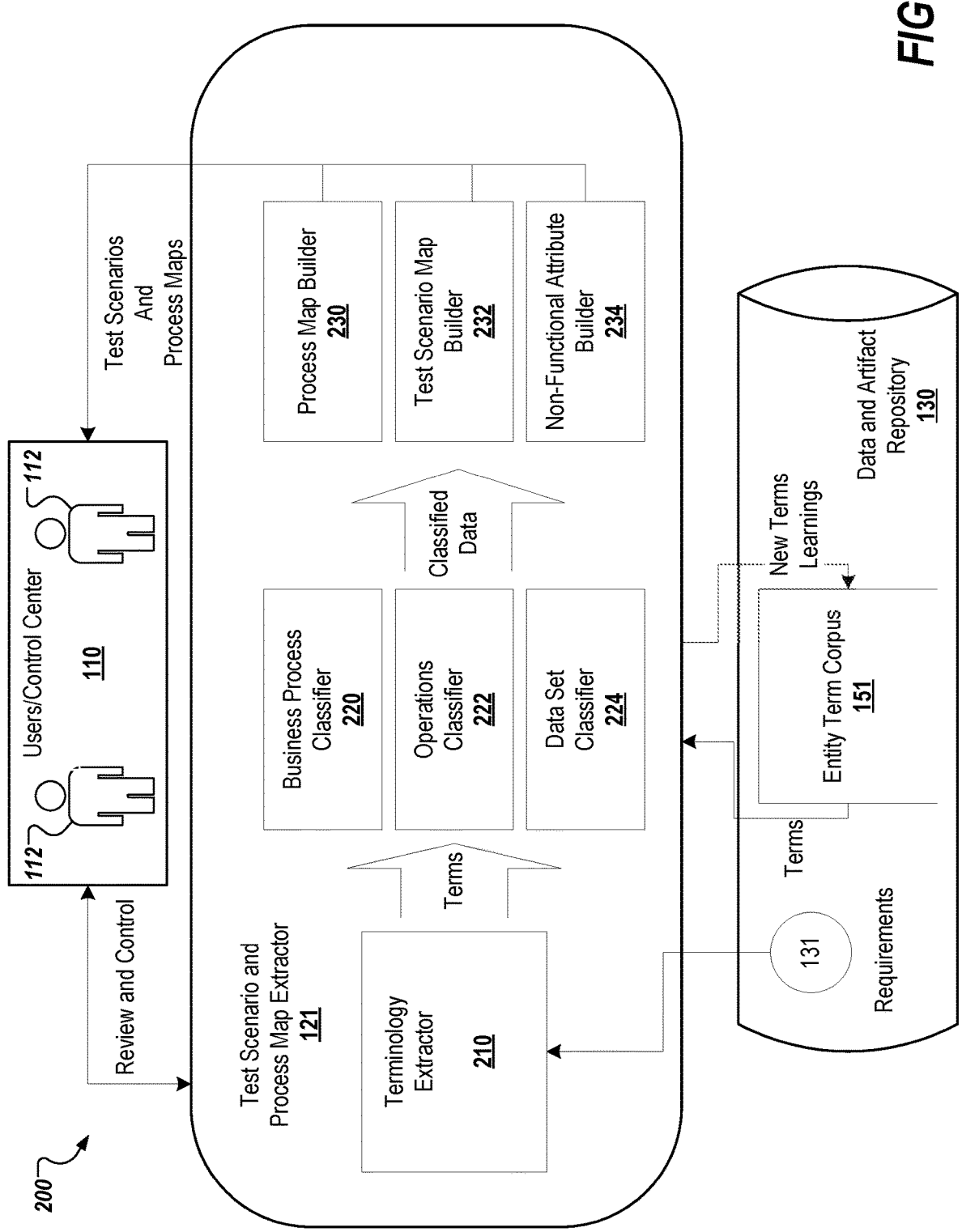

FIG. 2A depicts an example 200 of the test scenario and process map extractor engine 121, which includes terminology extractor module 210, business process classifier module 220, operations classifier module 222, data set classifier module 224, business process map builder module 230, test scenario map builder module 232, and non-functional attribute builder module 234. As described above with regard to FIG. 1, the test scenario and process map extractor engine 121 scans the requirements document and creates the high-level test scenarios and process maps that can be employed by the user 122, such as a test designer, to create test suites.

Terminology extractor module 210 extracts the various terminologies from the requirements document by using techniques, such as terminology extraction. For example, the terminology extractor module 210 may pick up key terminologies pertaining to business processes, operations, and/or data and control. This information is fed into, for example, one of the three classifier modules: business process classifier module 220, operations classifier module 222, and data set classifier module 224. Each of the three classifiers may classify the received terms into, for example, business processes, operations and actions, or data sets by using techniques, such as topic segmentation. The business process classifier module 220 classifies terminology pertaining to, for example, a business process described in the requirements document. The operations classifier module 222 classifies terminology pertaining to, for example, business operations applicable to business processes classified by the business process classifier module 220. The data set classifier module 224 classifies data and control information requirements to perform the operations classified by the operations classifier module 222. Each of the three classifier modules may also use entity term corpus 151, which is stored in data and artifact repository 130, as per testing requirements. The entity term corpus 151 includes business process terms, operations terms, technology terms, and data set terms that are domain specific and/or related to the scope of the respective requirements documentation. Once classified, the data is fed into the three builder modules. Three classifier modules are shown and described; however, other classifier modules may be employed in the test scenario and process map extractor engine 121.

The process map builder module 230 builds a process map (e.g., graph) using techniques, such as relationship extraction and/or semantic graphs. The process map may depict, for example, a hierarchy of business processes. The test scenario map builder module 232 builds a testing scenario using techniques, such as knowledge representation. The testing scenario can be depicted using a knowledge graph that may depict, for example, test scenarios, operations applicable to a respective process, and data sets required for such operations. The non-functional attribute builder module 234 identifies the requirements that need non-functional attributes (e.g., quality attributes) and extracts those attributes using techniques, such as relationship extraction. This information is passed to the users 122 by way of the control center 110.

FIG. 2B depicts another example 250 of the test scenario and process map extractor engine 121, which includes terminology extractor module 260, test scenario element classifier module 270, semantic graph builder module 280, process map builder module 282, and test scenario map builder and quality attribute extractor module 290. As described above with regard to FIGS. 1 and 2A, the test scenario and process map extractor engine 121 scans the requirements document and creates the high-level test scenarios and business process maps that can be employed by the user 122, such as a test designer, to create test suites.

In the depicted example 200, terminology extractor module 210 extracts terms 262 from requirements documentation. Operations classifier module 270 parses these extracted terms 262 and classifies them as/according to process terms 272, operations terms 274, and data set terms 276. Semantic graph builder module 280 uses the classified terms to construct a semantic graph. Process map builder module 282 uses the semantic graphs to construct process maps 284. Test scenario map builder 290 uses the generated semantic graphs and process maps to generate test scenario maps 292.

Terminology extractor module 260 is substantially similar to terminology extractor module 210 from FIG. 2A. Additionally, terminology extractor module 260 parses requirements documents stored in data and artifact repository 130 or otherwise received from user 112. Terminology extractor module 260 extracts key terminologies, extracted terms 262, pertaining to processes (e.g., business or system processes performed by a developed application), operations, actions, and flow and control of data. In some implementations, terminology extractor module 260 identifies a single word, double words, or multi-word terminologies based on the entity term corpus 151, which is stored in data and artifact repository 130. As stated above, the entity term corpus 151 includes business process terms, operations terms, technology terms, and data set terms that are domain specific and/or related to the scope of the respective requirements documentation. The extracted terms 262 identified or learned by terminology extractor module 260 form requirements documentation may include new terms. These new terms may be added to the entity term corpus 151, as shown in FIG. 2B.

Test scenario element classifier module 270 classifies the extracted terms 262 into process terms 272, operations terms 274, and data set terms 276 by employing techniques, such as, topic segmentation and so forth. Process terms 272 include terminology pertaining to, for example, a business process identified in the requirements documentation. Operations terms 274 include, for example, business operations applicable to the identified business processes. Data set terms 276 include information regarding requirements to perform the identified operations, such as what data a particular form requires or what type of data is needed for a parsing script to execute. Test scenario element classifier module 270 may employ a corpus of existing known terms to assist in identifying terms and classifying them accordingly.

Semantic graph builder module 280 processes classified terms to construct standardized, grammatically accurate, and non-ambiguous statements. For example, a requirement document may include language stating "The Foreign currency accounting modules should be able to produce general forex voucher which can support following 3 types of transactions: debit advice voucher, forex receipt voucher, and currency swapping voucher." A semantic graph for this line of requirement built for this information may include a node for "Foreign currency accounting" that is linked to a "general forex voucher" node, which is linked to nodes for "debit advice voucher," "forex receipt voucher," and "currency swapping voucher."

Process map builder module 282 employs the semantics graphs generated by semantic graph builder module 280 to generate process flow maps 284. A process flow map includes information as to how various processes are related to each other. Such as, how processes are hierarchically related. Example process flows include business processes that the respective application integrates with or manages. Other examples process flows include data flow processes, functionality, workflows, blockchains, and so forth. Each generated process flow map 284 may also include details of regarding operations and flow and control of data related to the respective process. The generated process flow maps may be stored in process map repository 286. In some implementations, user 112 reviews the generated process maps to update the information and/or merge them into the other data contained in the process map repository 286.

Test scenario map builder 290 uses the generated semantics graphs and process maps to generate test scenarios maps 292 for the respective requirements documentation. The semantics graphs and process maps include, based on the requirements documentation, processes and functionality that may be tested for an application, valid and invalid operations for each functionality, expected outputs, and the relationships, such as a hierarchically relationship, between the various processes.

The generated test scenario graphs may include, nested test scenarios. These scenarios (or groups of scenarios) can be reused across multiple requirements and applications. For example, login into the application" is a scenario that can be used in a "search for product" scenario and the "search for product" scenario may be part of a "compare products" scenario. The test scenario map builder 290 modularizes the requirements statements from a semantic graph(s) and converts them into complete statements using, for example, NLP. For example, requirements statements may be parsed to extract Intent, Objects, Actions, and/or expected results. The test data elements are also identified where available. Combinations of these are then used by the test scenario map builder 290 to build the complete statements. Test scenario map builder 290 then classifies functional and non-functional test scenarios. The functional scenarios may be used by the automation accelerator engine 122 to generate automation test scripts. The non-functional scenarios may be employed by a testing team(s) to generate test cases specific to their respective areas, such as performance, security, and architectural testing. In some implementations, the test scenario map builder 290 includes a non-functional attribute builder that scans the requirements document and extract requirements that are likely to have performance and scalability requirements. These non-functional attributes, such as response time, concurrent user limits, wait time, page, component load time, and so forth, are identified along with the specified values. These attributes are employed to build, for example, performance and load testing models. The generated test scenarios stored in data and artifact repository 130 are used by the automation accelerator engine 122, as described below.

Figure 3:
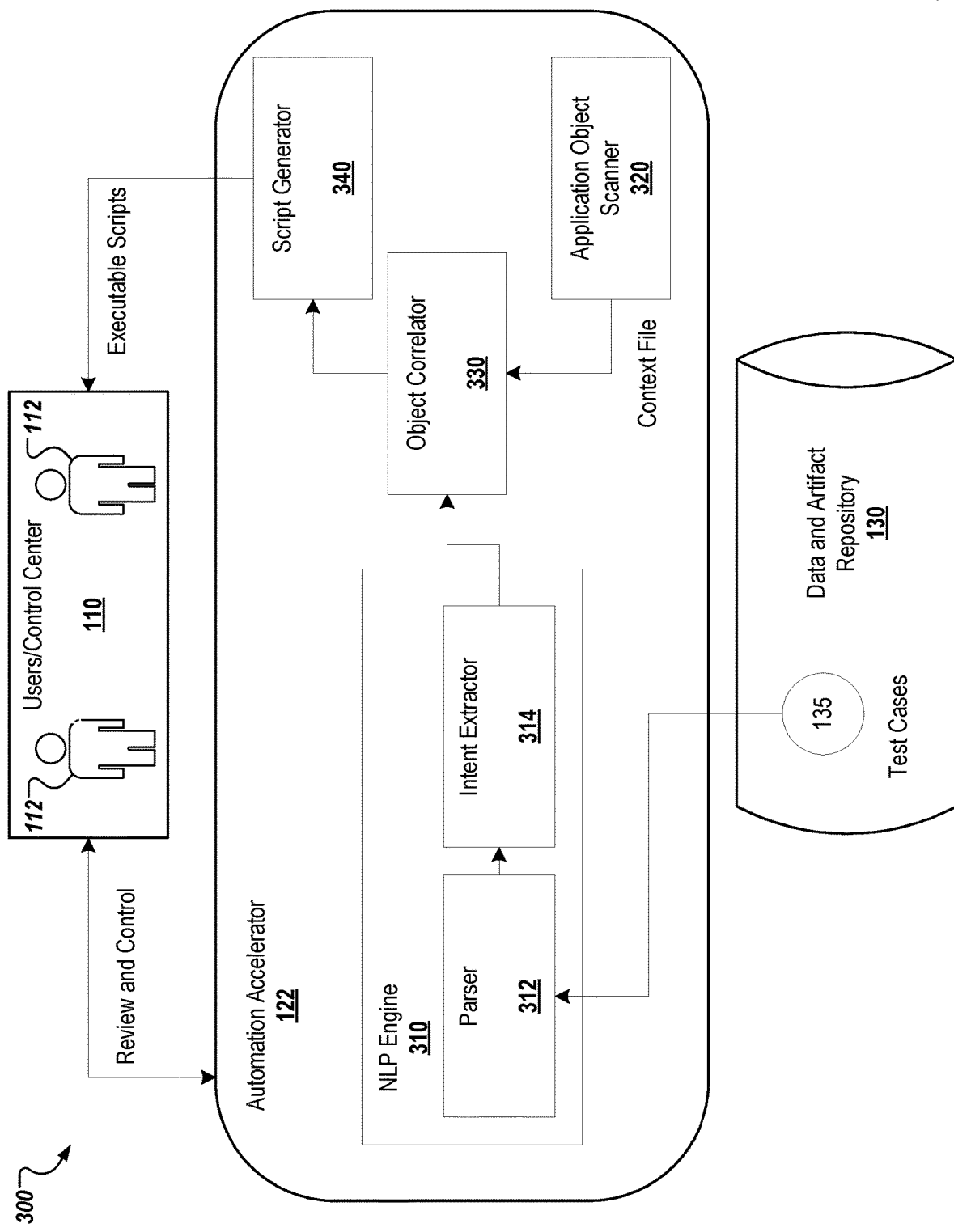
FIG. 3 depicts an example of the automation accelerator engine.

FIG. 3 depicts an example 300 of the automation accelerator engine 122, which includes NLP engine 310, application object scanner module 320, object correlator module 330, and script generator module 340. The NLP engine 310 includes parser module 312 and intent extractor module 314. As described above with regard to FIG. 1, the automation accelerator engine 122 analyzes manual test cases, extracts the intent, and converts the intent into executable automated scripts.

For example, the automation accelerator engine 122 generates an automated testing script(s) from a provided test scenario and context file. The automation accelerator engine 122 extracts the intended interaction (intent) and relevant testing data from each test scenario through the employment of, for example, natural language processing (NLP) techniques. The intent is correlated to an appropriate test object (s) in the provided context file. For example, if the test scenario recites "Click on the Submit button," the automation accelerator engine 122 parses the natural language and derives the context as "submit button," which it then maps to the submit button object from the object map of the submitted context file. A template for the selected automation tool is applied to the extracted intent and data along with the correlated object(s) to generate the resulting automated testing script.

At a high level, the NLP Engine 310 employs NLP to parse and extract the intent from manual test cases. The object correlator module 330 creates the logical objects in accordance with the extracted intent, which it maps to objects in the context file. The application object scanner module 320 scans the tested application or system and identifies the objects within, for example, the UI pages. The script generator module 340 generates the test scripts bases on the input from object correlator module 330.

For example, test cases (e.g., test scenarios) may be described in a free flow language form, without any well-defined format, and in the natural or agreed upon language of the parties, such as English. Thus, it is difficult for a computer program to translate this information into an automated testing script. Moreover, development projects are increasingly using test scenarios written in a behavior-driven development (BDD) style using a formatted language, such as Gherkin. The formatted language allows instructions to be written as plain text in a traditional written language, such as English, with some additional structure. These formatted languages are designed to be easy to learn by non-programmers, yet structured enough to allow concise descriptions of examples to illustrate business rules in most real-world domains. In this way, the formatted languages can be used to capture requirements and define the test scenarios.

By way of example, a test scenario or list of scenarios may be included in what is called a feature file, where a formatted language, such as Gherkin, is used to write the scenarios in a human readable way. Such a feature file may be used in the generation of an automated testing script for an automation tool. Example automation tools include Unified Functional Testing (UFT), Tricentis Tosca™, Worksoft Certify™, and Selenium™. The testing automation tool provides a framework that can be used to provide support software structures, such as step definitions, for each of the test scenarios. Step definitions act as skeleton placeholders where automation code blocks may be implemented. For example, each step in a given scenario may map to a step definition. The automation code block is implemented for each step definition and executed when the scenario is run by the testing framework. The automation code block may be written in a variety of programming language, such as Ruby, C++, Java, Scala, Python, and so forth, selected based on system requirements. Once generated, the step definitions and respective code blocks may be referred to as an automated testing script. The testing automation tool provides an execution environment for these generated scripts, which may be run for acceptance and/or regression testing.

The automated testing scripts may be implemented manually by a developer or generated automatically. One of the difficulties with automatic code generation of an automated testing script from a test scenario is that the test scenario may be written in many different ways because of the flexible nature of the formatted language (e.g., Gherkin). For example, each tester may describe the functionality or function of a test in his or her own way. For instance, "click on the submit button," "push the submit button," or "hit the submit button," all of which mean the same thing. Another issue is that the code blocks in an automated testing script may be repetitive; hence, the automation code may become bloated. Additionally, the free form English (or any other language), which may be used in the bulk of the file, lacks structure. For example, "Login to the application" and "Enter the user name, enter the password, and click sign in button" both denote the same function; one is a single sentence, but the other is three sentences. However, the same automation code block (script) should be generated in each of these examples.

The automation accelerator engine 122 parses a provided test scenario base on natural language processing techniques to determine the scenario's intent for the code base that is being testing along with any data relevant to the scenario. As an example, a scenario's intent may be to login to a given application or program, such as a web application, with a username and password or to complete a particular form in the web application with a certain set of information. In the proceeding example, the username and password and the set of information are the data relevant to the scenario. The system correlates the intent with an object(s) on a selected page or screen of the web application. Once the intent and objects are correlated, the system selects a template(s) corresponding to a designated automation tool to generate the automated testing script for the provided scenario. Once the test scenario has been translated to an automated testing script, the test scenarios can be tested frequently and used in a variety of testing processes using the respective automated testing script. Additionally, the automated testing script may be more precise than the manual versions and may be used in the generation of reports regarding respective application and/or the results of the testing.

In the depicted example, the NLP engine 310 receives a test scenario(s) from the data and artifact repository 130, and optionally, a context file from the control center 110. The received test scenarios may be generated by the test scenario and process map extractor 121 engine as described above. The test scenarios may also include existing test cases, feature files, API definition files, such as Web Services Description Language (WSDL), Web Application Description Language (WADL), Swagger, and so forth. The NLP engine 310 receives the input and parses the test scenarios. NLP can be described as the ability of a computer program or software to understand human speech as it is spoken or written. The NLP engine 310 may employ an NLP application program interface (API), such as Apache OpenNLP™.

As an example, the parser module 312 reads a line or set of lines from the received test scenario, which may be included in a feature file. The parser module 312 determines the various objects in the sentence(s) in the feature file. The objects are used to provide a context for the instructions in the test scenario. Based on this information, the intent extractor module 314 determines the intent of the scenario for each of the identified objects. For example, the scenario might read "to login, to enter a username, to enter a password, to click on submit, enter navigation." The intent extractor module 314 extracts the various intents for this scenario (e.g., "click," "login," and "enter"). Once the intent has been identified, it may be correlated to the object(s) in the context file by the object correlator module 330 based the context file received from the application object scanner module 320 and selected through the control center 110 by users 112.

Custom actions can also be trained into the intent parser module 312 for complex descriptions. The intent extractor module 314 also identifies, for each determined intent, any associated data, for example, a username and password. Techniques such as text parsing, tokenizer, and name finder can be used to identify the mention of custom data within the test scenario as data specific words may be mentioned in any part of a sentence.

The object correlator module 330 takes the identified intent and any associated data and correlates the information to objects within the context file. The object correlator module 330 first generates a name for the intent based on the NLP processing. The name is based on the context provided in the test scenario, and is referred to as a logical name. The object correlator module 330 searches the object map in the context file to determine the best matching object. For example, a test scenario regarding a web application selling various products may have a movie store section. A test scenario, for example, a login to the movie store, may refer to the section of the site as "DVD movie store." The intent extractor module 314 may determine the intent for the scenario as "enter the DVD movie store," where "DVD movie store" is the logical name assigned to the object. The object correlator module 330 takes the assigned logical name and searches the object map from the context file for an object that has an identifier that matches the logical name or is the closest match to the object's name. This match is determined based on the determined intent, NLP of the objects, and any corresponding data in the context file (e.g., identifier and/or associated parameters). The object correlator module 330 correlates the intent (e.g., login, enter, click) to the matched object from the context file. For the movie store example, the object correlator module 330 may return an object corresponding to a button or link that takes the user to the DVD movie store section of the site, which is then correlated with the intent or action of the scenario (e.g., click on the movie store link).

The script generator module 340 generates an automated testing script based on the determined intent and the associated data from the provided scenario and the correlated object(s) from the provided context file. For example, the determined intent could be at an elementary level (click, enter) or a business process level (login, fill out a form). A login may require a series of steps, such as 1) enter user name, 2) enter password, and 3) click sign on. Another example may be to create a purchase order, which could entail filling out a form with multiple steps.

To generate the file, the script generator module 340 may employ an AI model trained through a series of machine-learning techniques applied to an algorithm using these elementary and business level steps. Machine learning automates model building and allows for the discovery of insights without being explicit programming. Using automated and iterative algorithms, models may be trained to find high-order interactions and patterns within data. The AI model may be trained for a particular application or program to apply action(s) required to complete various tasks or processes within the application. For example, an AI model may be trained to understand what a purchase order means, what login means, and how to perform each within the particular application or program. In some implementations, the provided context file is used to determine the appropriate AI model to employ to build the resulting automated testing script.

The script generator module 340 selects a script template (s) from the data and artifact repository 130. In some implementations, the script templates are a standardized form for automation, which may be employed in keyword driven, data driven and/or hybrid automation frameworks. In some implementations, the script templates are standard or proprietary templates defined by an automation tool, such as Tricentis Tosca™. The script template is selected based on the automation tool for which the automated testing script is being generated (e.g., UFT, Tricentis Tosca™, Worksoft Certify™, or Selenium™). Based on the AI model, the script generator module 340, determines the action(s) to perform the determined intent to the correlated objects in the respective page of the UI being tested. The script generator module 340 generates the automated script by applying the selected template to the determined actions for the intent and correlated objects, the data read from the provided test scenario, and the step definitions from the test scenario (e.g., the feature file). The data may also be read from a configuration or properties file. This data may be used as the default data unless specific information is provided in the test scenario. In some instances, the actions may not require any additional data, such as, for example, when simply following a link or clicking a button of a particular page within the UI.

Figure 4:
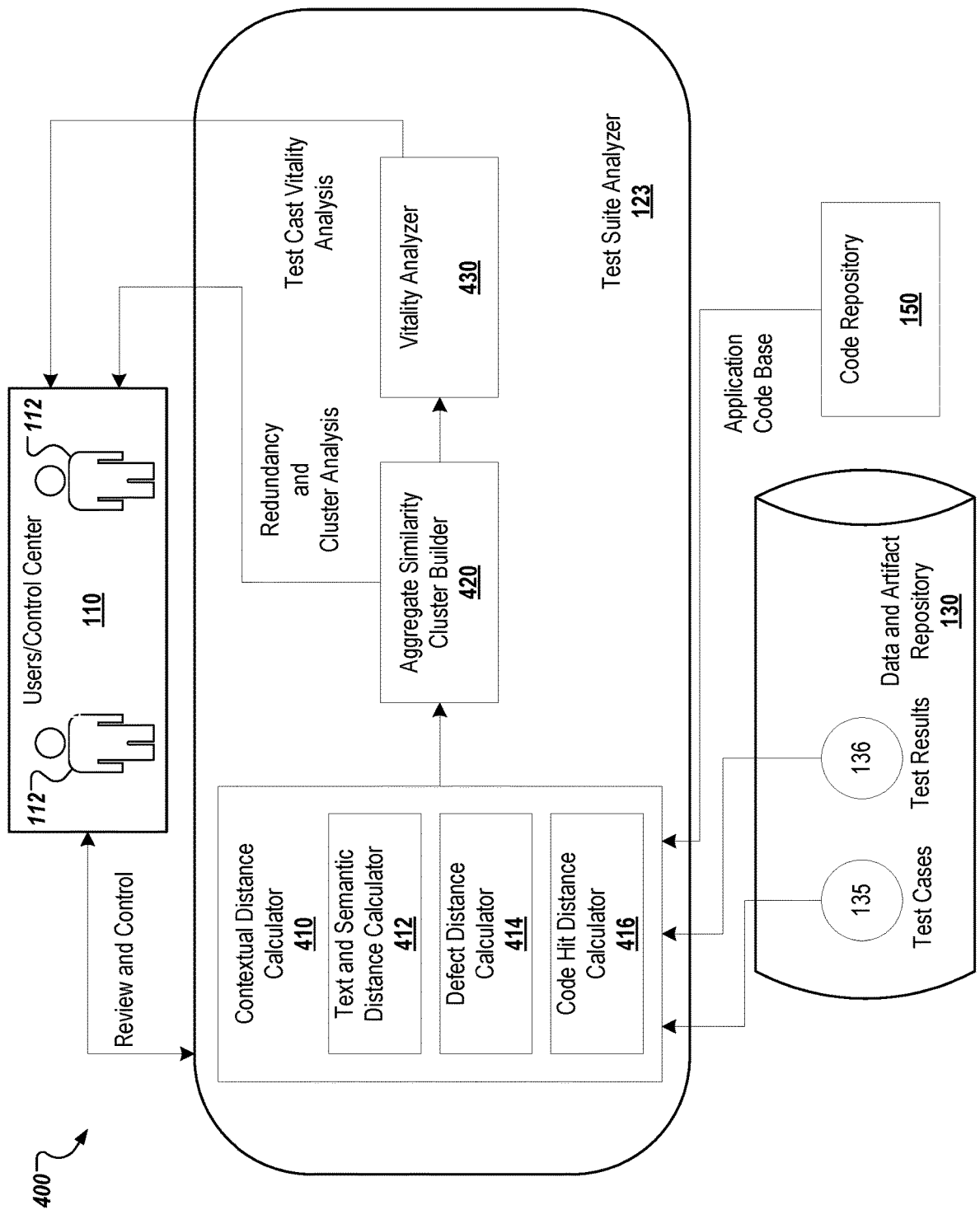
FIG. 4 depicts an example of the test suite analyzer engine.

FIG. 4 depicts an example 400 of the test suite analyzer engine 123, which includes contextual distance calculator module 410, aggregate similarity cluster builder module 420, and vitality analyzer module 430. As described above with regard to FIG. 1, test suite analyzer engine 123 analyzes test suites and groups contextually similar test cases into clusters based on contextual distance. These clusters enable the user 112, such a test analyst, to identify duplicate test cases and optimize test suite execution.

The contextual distance calculator module 410 calculates the contextual distance between test cases. The contextual distance calculator module 410 employs the test cases 135 and the test results 136 from data and artifact repository 130 as well as the application code base stored in code repository 150. The contextual distance calculator module 410 includes text and semantic distance calculator module 412, which determined the similarities of test cases based on, for example, textual content and semantics; defect distance calculator module 414, which determines the similarities of test cases based on, for example, the defects each respective test cases is detecting; and the code hit distance module 416, which determines the similarities of test cases based on, for example, the portions of code being executed by the test cases. The aggregate similarity cluster builder module 420 receives the calculated contextual distance information regarding the test cases and constructs similarity clusters. The vitality analyzer module 430 then takes the clustered data to analyze each test case and its robustness to detect defects based on, for example, past history. For example, each test case may be assigned a score value based on its robustness to detect defects respective to the other test cases in an assigned cluster. This information is passed to the users 122 by way of the control center 110.

Figure 5:
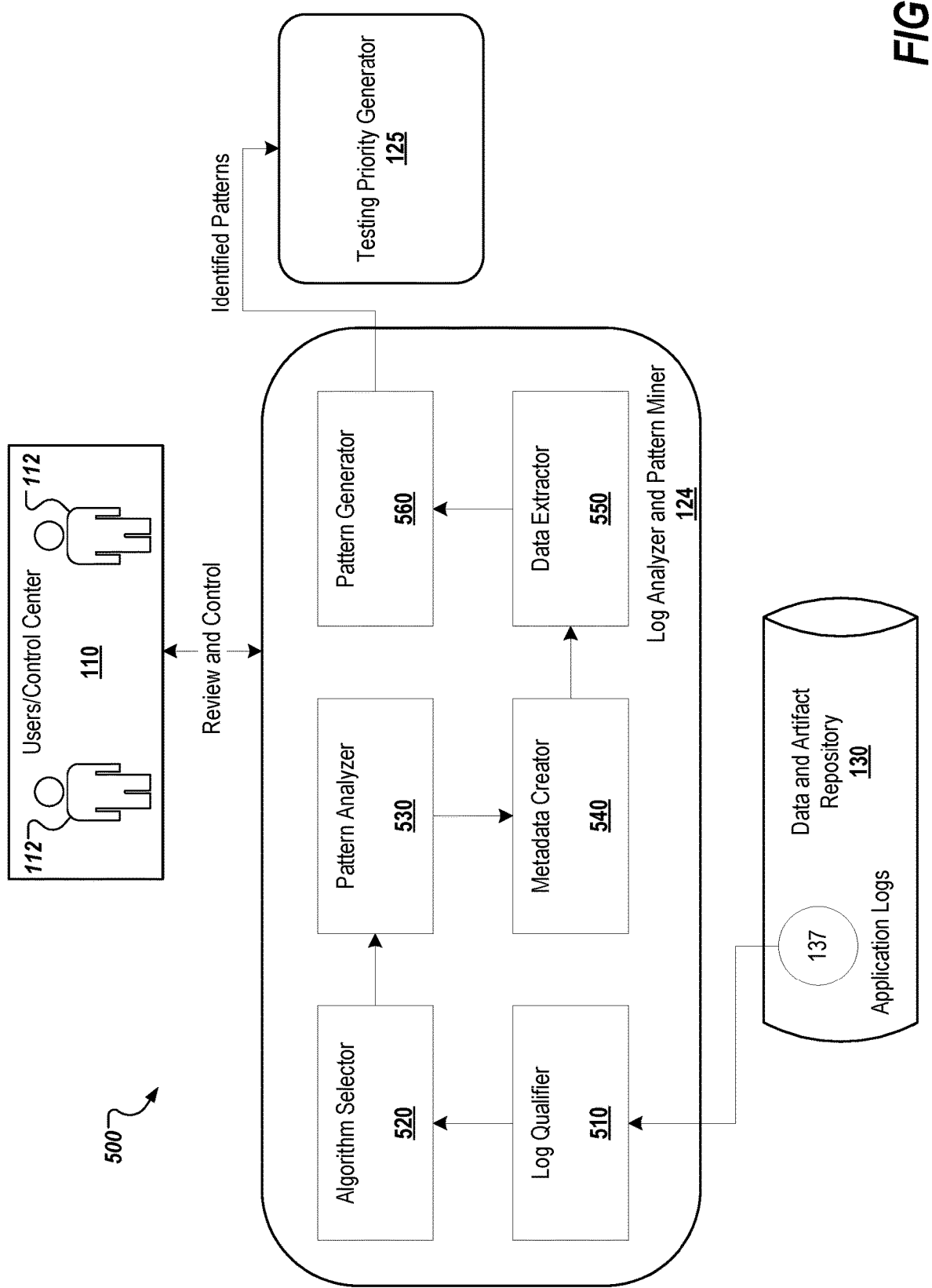
FIG. 5 depicts an example of the log analyzer and pattern miner engine.

FIG. 5 depicts an example 500 of the log analyzer and pattern miner engine 124, which includes log qualifier module 510, algorithm selector module 520, pattern analyzer module 530, metadata creator module 540, data extractor module 550, and report generator 560. As described above with regard to FIG. 1, the log analyzer and pattern miner engine 124 ingests and analyzes the logs from deployment environments, such as the production or test environment and extracts various insights, such as usage and/or failure patterns, typical system behaviors, anomalies (which in turn can be used as early warning of potential failures).

The log qualifier module 510 qualifies the collected logs from various sources, such as application logs, server logs and UI logs. The algorithm selector module 520 receives the qualified logs from log qualifier module 510 and selects a pattern-mining algorithm based on the initial qualification. The pattern analyzer module 530 receives the selected pattern and qualified logs to analyze patterns present in the logs. Both technical and functional information can be mined from the production logs. Examples of functional information include combinations of values used for a scenario or use case. Example of technical information include the code modules, services, packages, methods, scripts that are executed for a particular flow and/or the frequency with which they are being executed. The metadata creator module 540 receives the information regarding patterns from the pattern analyzer module 530 and creates metadata for each of the pattern groups. The data extractor module 560 receives the information from the prior modules and extracts the various data of interest from the identified patterns. The pattern generator module 560 receives the determined information from the other modules and generates information regarding patterns that are identified in the log files. This pattern information may include usage patterns, failure patterns, business flow graphs, and anomalies. The pattern information is passed to the testing priority generator engine 125.

Figure 6A:
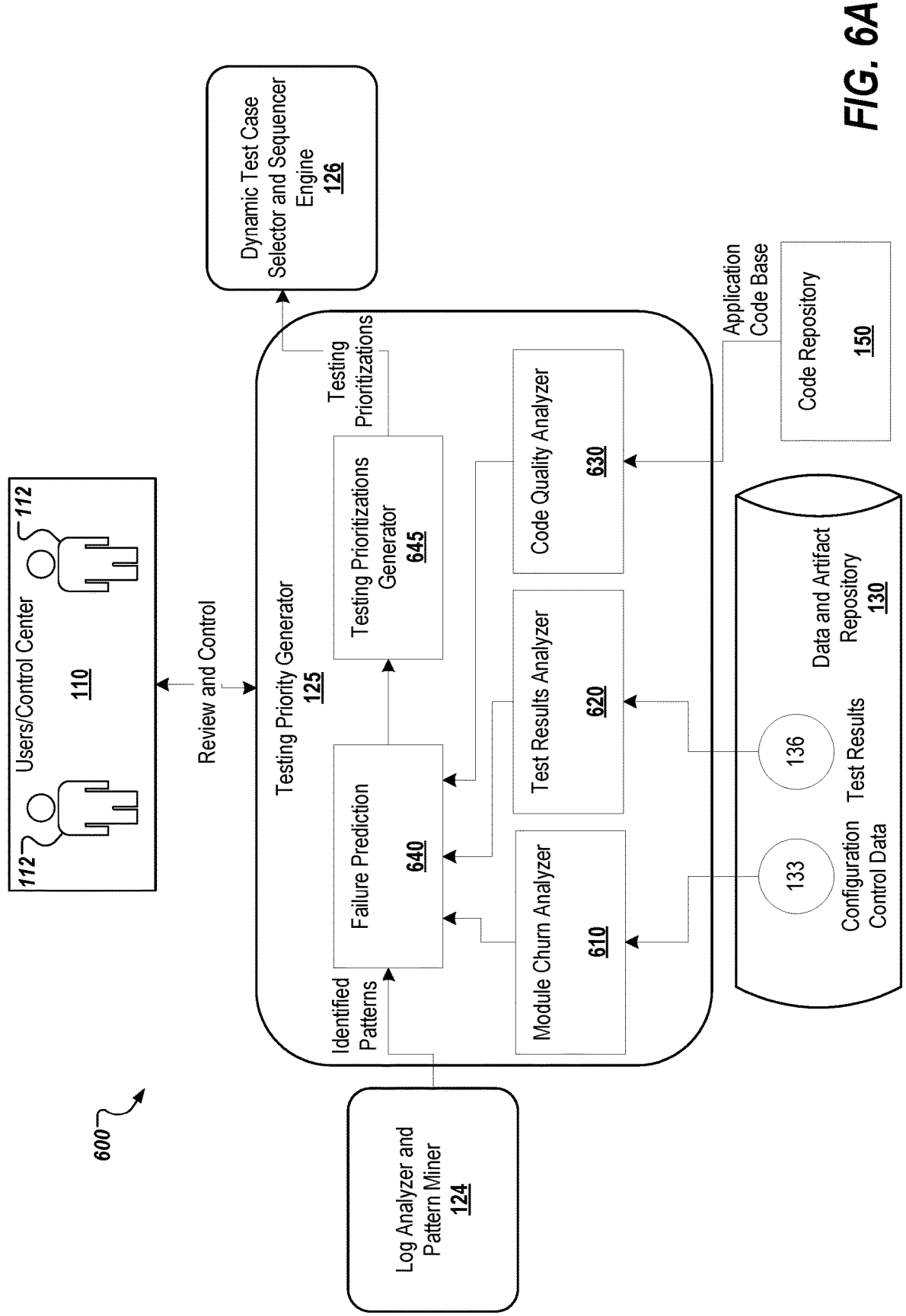
FIG. 6A depicts an example of testing priority generator engine.

FIG. 6A depicts an example 600 of testing priority generator engine 125, which includes module churn analyzer module 610, test results analyzer module 620, code quality analyzer module 630, failure prediction module 640, and testing prioritizations generator 645. As described above with regard to FIG. 1, the testing priority generator engine 125 generates testing prioritizations that may include graphical representations, such as heat maps, that depict usage patterns, code coverage, failure patterns, module churn, code quality analysis, or a combination thereof.

The module churn analyzer module 610 continuously analyzes configuration and control as well as module churn data 133. The test results analyzer module 620 continuously analyzes the results of execution runs 135 and extracts failure patterns. The code quality analyzer module 630 analyzes static code quality based on preset rules. The static code can be received from code repository 152, which can be stored in data and artifact repository 130. The failure prediction module 640 receives the extracted and analyzed information from modules 610-630 as well as the identified pattern information from the log analyzer and pattern miner engine 124 and employs machine-learning algorithms to predict which functionalities in the tested application or system are likely to fail. The testing prioritizations generator 645 generates testing prioritizations, which include a prioritization of code modules and/or functionality (that may be related to the code modules) of the application or system that is being tested along with the associated test cases. The testing prioritizations may also include a prioritization of the test cases according to the associated functionality, code module(s), and/or line(s) of code that is being tested. A graphical representation depicting relative test priorities of functionalities and associated test cases may also be included in the testing prioritizations. As described below in the description of FIG. 7, the generated testing prioritizations are employed by the dynamic test case selector and sequencer engine 126 to select and sequence test cases (and associated testing scripts) to, for example, optimize test resource utilization.

Figure 6B:
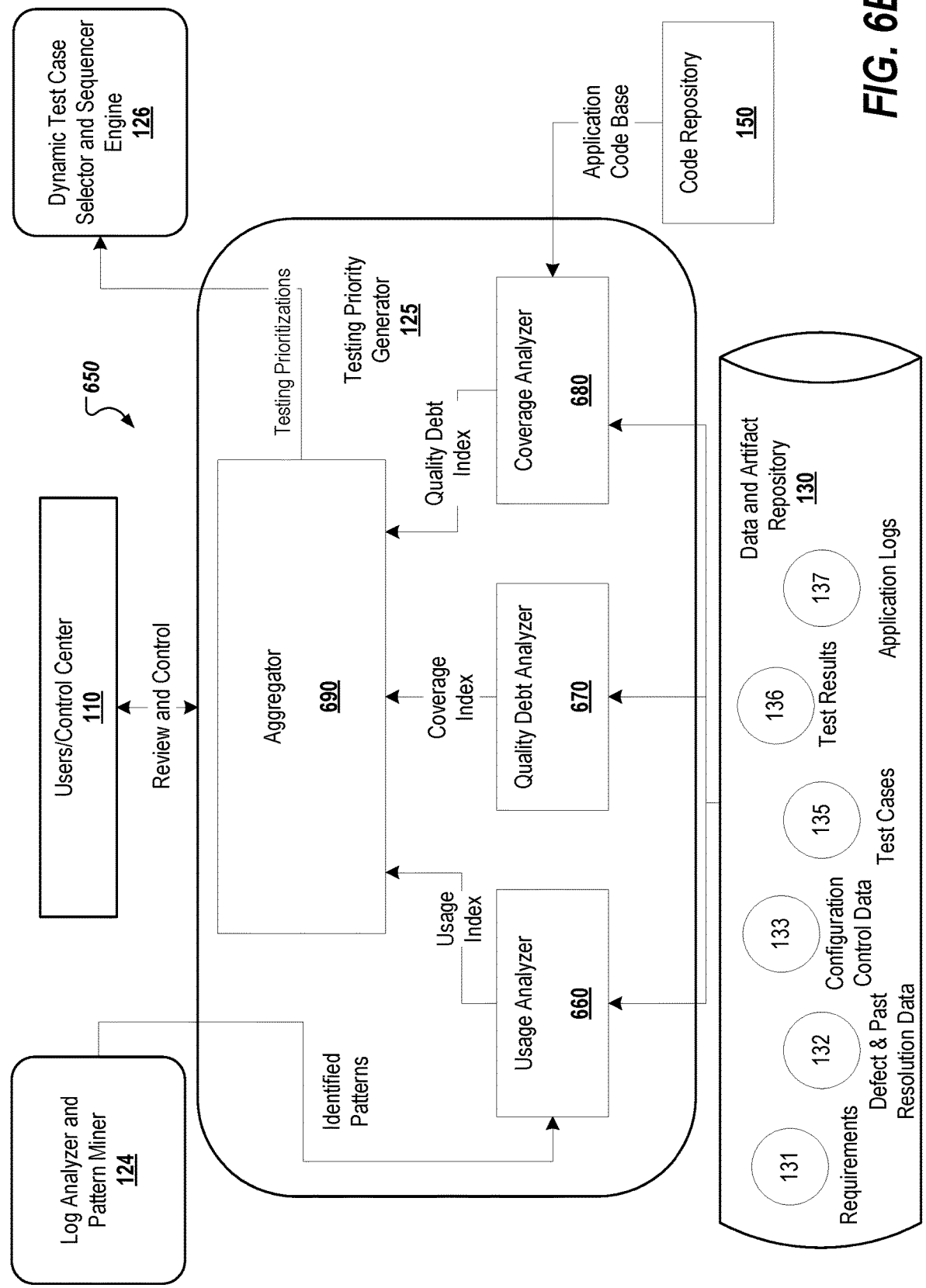
FIG. 6B depicts another example of testing priority generator engine.

FIG. 6B depicts another example 650 of the testing priority generator engine 125, which includes quality usage analyzer module 660, quality debt analyze module 670, coverage analyzer module 680, and aggregator module 690. As described above with regard to FIGS. 1 and 6A, the testing priority generator engine 125 generates scores and/or applied weighted values for the prioritization of test cases and code modules. Such code modules may include packages, methods, functions, and so forth. The scoring and/or weighted values can be based on, for example, performance criteria, such as defect discovery, coverage, resource optimization, and so forth. In some implementations, the generated testing prioritizations include the relationship between the code modules and/or functional modules as well as related test cases weighted according to the performance criteria. The testing prioritizations are employed by the dynamic test case selector and sequencer engine 126 to select and sequence test cases. To determine testing prioritizations, the testing priority generator engine 125 analyzes requirements 131, test cases (both historic and new) 135, historic defects and defects from production 132, and application log files 137 as well as the application code base stored in code repository 150. The application code base along with the configuration and control data 133 and test cases 135 are employed to discover analytics and statistical data such as code changes, test case to code mapping, outputs of static code analysis.

An understanding of how end users actually use an application or system is essential to test optimization. As such, the usage analyzer module 660 analyzes the aspects of the tested applications or systems that are being exercised by users in production and the flows and channels (e.g., the features, services, packages, methods and so forth of the application or system) followed by such users. The identified patterns received from the log analyzer and pattern miner engine 124 are used by the usage analyzer module 660 to determine the actual use of the system in production. This information, regarding the flows and channels being used, can be compared to, for example, the flows defined by analysts during, for example, a requirements definition phase of software development.

For example, in the context of a single session, the particular sequence(s) in which services, packages, methods, and scripts were executed can be determined and analyzed to provide a unique count and/or frequencies of such sequences. Both the technical and functional information mined from the log files and included in the identified patterns received from the log analyzer and pattern miner engine 124 can be correlated with test cases by the usage analyzer module 660 using, for example, association rule mining to identify which test cases mimic end user behaviors most closely according to a threshold value(s). The data may then be used to generate a matrix correlating application usage in production to test cases. Such a matrix can be employed to create a representation (used by or integrated into the testing prioritizations), such as a heat map, of module (code or functional) usage, the distribution of data across service types and/or channels within the tested application or system and/or test case utilization based on, for example, actual usages in production.

Quality debt analyzer module 670 analyzes, for example, the defects raised during previous phase, releases, and cycles of the development of an application or system as well as current defects raised in production and/or staging environments for the respective application or system. Additionally, the quality debt analyzer module 670 performs static and dynamic code analysis to determine the vitality of a test case (e.g., the ability of a test case to identify defects historically) and/or map test cases to defects.

In some implementations, vitality analysis performed by the quality debt analyzer module 670 includes processing of test execution data for available execution cycles and determining an effectiveness metric that indicates an effectiveness of a test case for defect discovery. For example, test cases that have failed (e.g., identified defects) in the past are assigned a higher priority and test cases that have never or infrequently failed (e.g., never or infrequently identified defects) are assigned a lower priority. To assign such priority, a weighted value can be assigned to each test case and/or parameters associated with each test case. These parameters may include a number of times that a test case has been executed and a most recent date when a test case has failed.

Production defects can be attributed to, for example, data issues, special use cases, and business knowledge deficit of testers. The impact of these common causes for production defects can be minimized by analyzing the defects identified and sharing insights gleaned from this data with testers. In some implementations, the quality debt analyzer module 670 clusters defects (found in production and/or user acceptance testing (UAT)) based on, for example, semantics using text analytics and/or context using knowledge mapping. Defects within each clusters will be similar and/or related based on clustering criteria, such as similarities in component(s) or functionality(ies) tested, data used for input(s) and/or outputs, similar identified symptoms, and so forth. Similarly, the quality debt analyzer module 670 clusters test cases based on, for example, semantics using text analytics or functionality and the related code that is exercised/executed. The clusters of defects are then mapped to clusters of test cases using, for example, association rule mining, which is similar to how the aggregate similarity cluster builder module 420 clusters data in FIG. 4. This mapping of test cases to defects helps to identify test coverage based on the actual defects being reported by, for example, business users and/or testers. (e.g., users 112). The mapping also helps to identify gaps in coverage, both code and functionality) and to prioritize the test clusters that are mapping to, for example, prioritized defects.

The coverage analyzer module 680 maps test cases to actual lines of code from the application (or system) code base stored in the code repository 150. For example, the amount and specific lines of code that are exercised by each suite of test cases can be mapped by coverage analyzer module 680. By maximizing lines of code exercised by a minimal set of test cases, high levels of testing efficiency can be achieved. In some implementations, an agent called (referred to as a code hit analyzer) is installed on, for example, an application server during an initial setup phase. An entire test suite is then executed against the application or system. The code hit analyzer agent captures information for each test case. Such captured information may include, the number of lines of code exercised, the unique lines of code exercised, the code complexity (based on, for example, a number of loops and/or conditional statements), and so forth. The data captured during this initial execution may then be tabulated and weightages applied to lines of code to generate an initial coverage report. The weightages may be based on, for example, uniqueness and complexity depending on the project context.

In some implementations, when code is changed to implement an enhancement or bug fix, the lines of code modified, added, and/or deleted can be automatically identified using, for example, software configuration management tools. The impacted lines of code may then be analyzed against the initial coverage report to identify, for example, whether the existing test cases are adequately testing the functionality, which test cases exercising the impacted lines of code, and/or are new test cases required. The results of such analysis may be aggregated in a coverage index that is sent the aggregator 690. Additionally, the coverage index can be used to generate a coverage effectiveness report where, for example, higher scores indicate a higher priority test case and/or a higher impact code module.

The aggregator module 690 receives and consolidates the output from each of the quality debt analyze module 660, usage analyzer module 670, and coverage analyzer module 680 to generate testing prioritizations, which include the prioritization of code modules and/or functionality (which may be related to the code modules) of the application or system that is being tested along with the associated test cases. The testing prioritizations may also include a prioritization (based on the applied scoring and/or weighted values) for each test case according to the associated functionality, code module(s), and/or line(s) of code that is being tested. As described below in the description of FIG. 7, the generated testing prioritizations are employed by the dynamic test case selector and sequencer engine 126 to select and sequence test cases (and associated testing scripts) to optimize test resource utilization.

Figure 7:
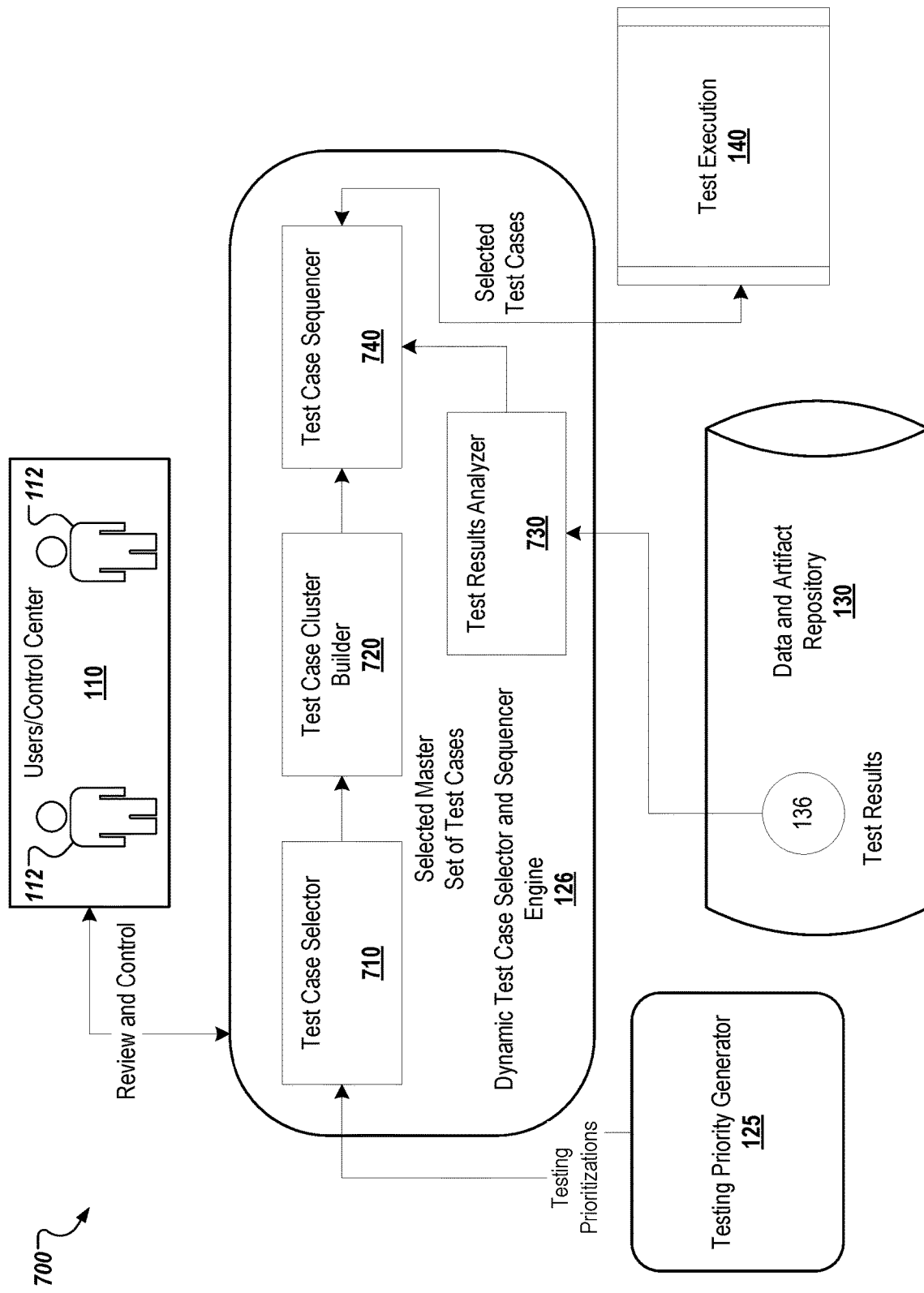
FIG. 7 depicts an example of dynamic test case selector and sequencer engine.

FIG. 7 depicts an example 700 of dynamic test case selector and sequencer engine 126, which includes test case selector module 710, test case cluster builder module 720, test results analyzer 730, and test case sequencer module 740. As described above with regard to FIG. 1, the dynamic test case selector and sequencer engine 126 selects a next set of test cases to be executed based on the received testing prioritizations.

The test case selector module 710 selects test cases to be executed based on the testing prioritizations received from testing priority generator 125. The test case selector module 710 may also employ selection criteria to select the test cases. Such criteria may include criterion increases to coverage (both functional and/or code), utilization, data and work flows, and so forth. The test case cluster builder module 720 clusters the selected test cases based on, for example, contextual similarity. The test results analyzer 730 continuously analyzes the results of execution runs and extracts failure patterns 136. Test case sequencer module 740 receives the selected and clustered test cases as well as the execution results and uses, for example, reward seeking machine-learning algorithms to set execution sequence of the clustered test case based on a configurable criterion, such as to maximize defect yield per test case. Test case sequencer module 740 may also employ the testing prioritizations received from the testing priority generator engine 125 to determine the sequencing of the test cases. This sequence of test cases is passed to the test execution engine 140.

The test execution engine 140 includes an auto-script server that runs the automation tools/platforms, such as Unified Functional Testing (UFT), Tricentis Tosca™, Worksoft Certify™, or Selenium™, employed within the touchless testing platform system 100. Such automation tools are used to provide stakeholders with information about the quality of the application or system being tested. The test execution engine 140 may be deployed on a server or virtual server.

Figure 8:
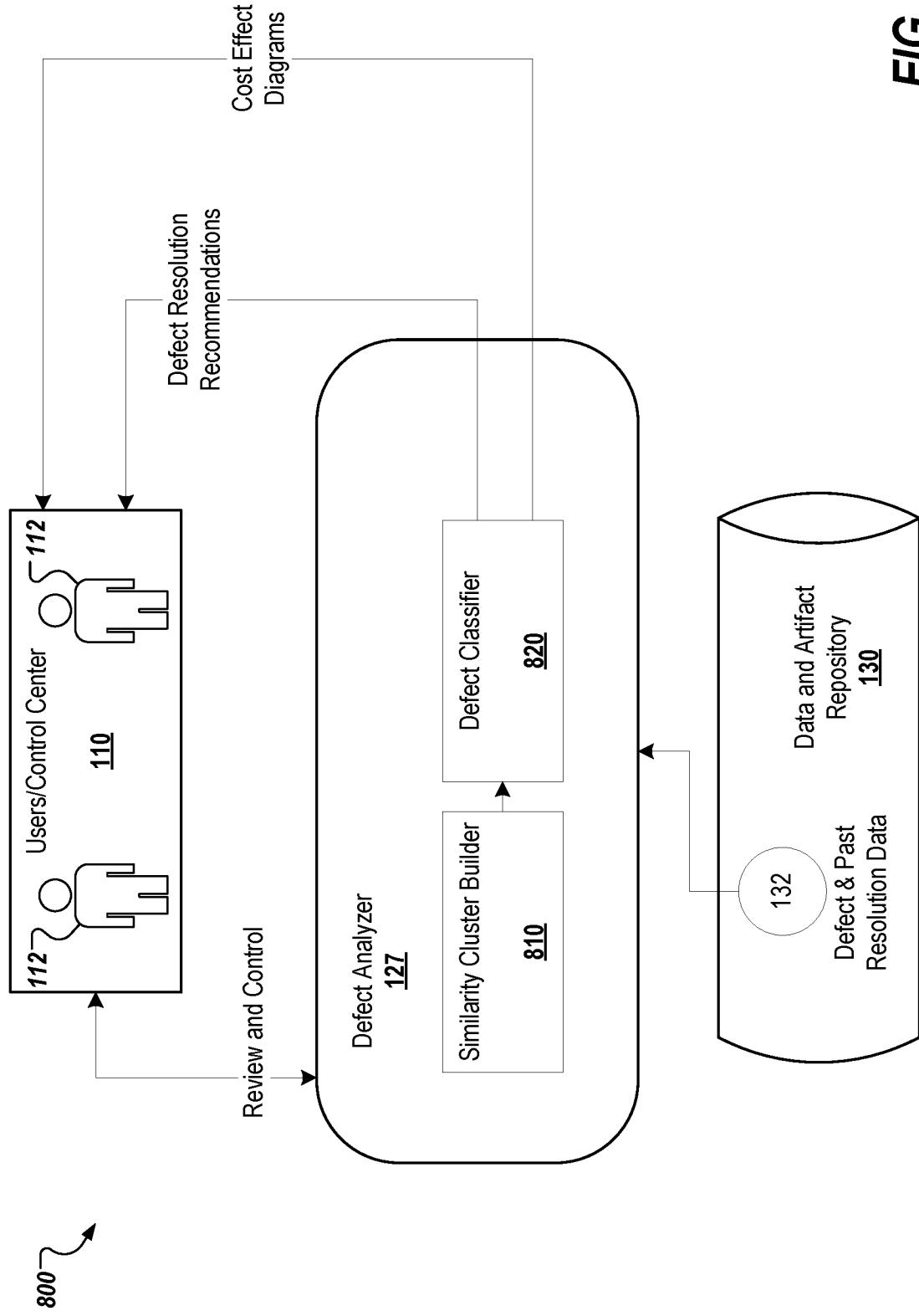
FIG. 8 depicts an example of dynamic defect analyzer engine.

FIG. 8 depicts an example 800 of dynamic defect analyzer engine 127, which includes similarity cluster builder module 810 and defect analyzer module 820. As described above with regard to FIG. 1, the dynamic defect analyzer engine 127 analyzes the defect found through the execution of the sequence test case and other test cases run against the tested application or system. The dynamic defect analyzer engine 127 determines recommendation resolutions and executes determined resolutions based on configurable criteria, such as threshold events.

The similarity cluster builder module 810 clusters defects 132 based on similarity analytics. The defect analyzer module 820 classifies the clustered defects based on an AI module trained through machine learning with, for example, past resolution data. This determined recommendation and results of executed resolutions are passed users 112 by way of the control center 120. In some implementations, the dynamic defect analyzer engine 127 may determine, through the defect analyzer module 820, a resolution for a defect reported based on a result of an execution of a testing script assigned to one of the sequence set of test cases and implement the resolution in the code base for the application or system to be tested.

The control center 120 may provide this information to the users 112 through a reporting engine, which provides analytics and access to the reporting features. The execution engine 160 may persist results from the execution of the generated automated testing scripts in a reporting database (not shown). The reporting engine may generate reports from the information stored in the reporting database, which can be reviewed by users 112. These reports provide details on the performance of the system during the execution of the automated testing scripts and may include processing time, response time, and any warning messages displayed as well as the information generated by the various engines 131-137 of the touchless testing platform module 120. Statistical reports may also be generated that summarize the health of the system as well as the any significant data points selected.

Figure 9A:
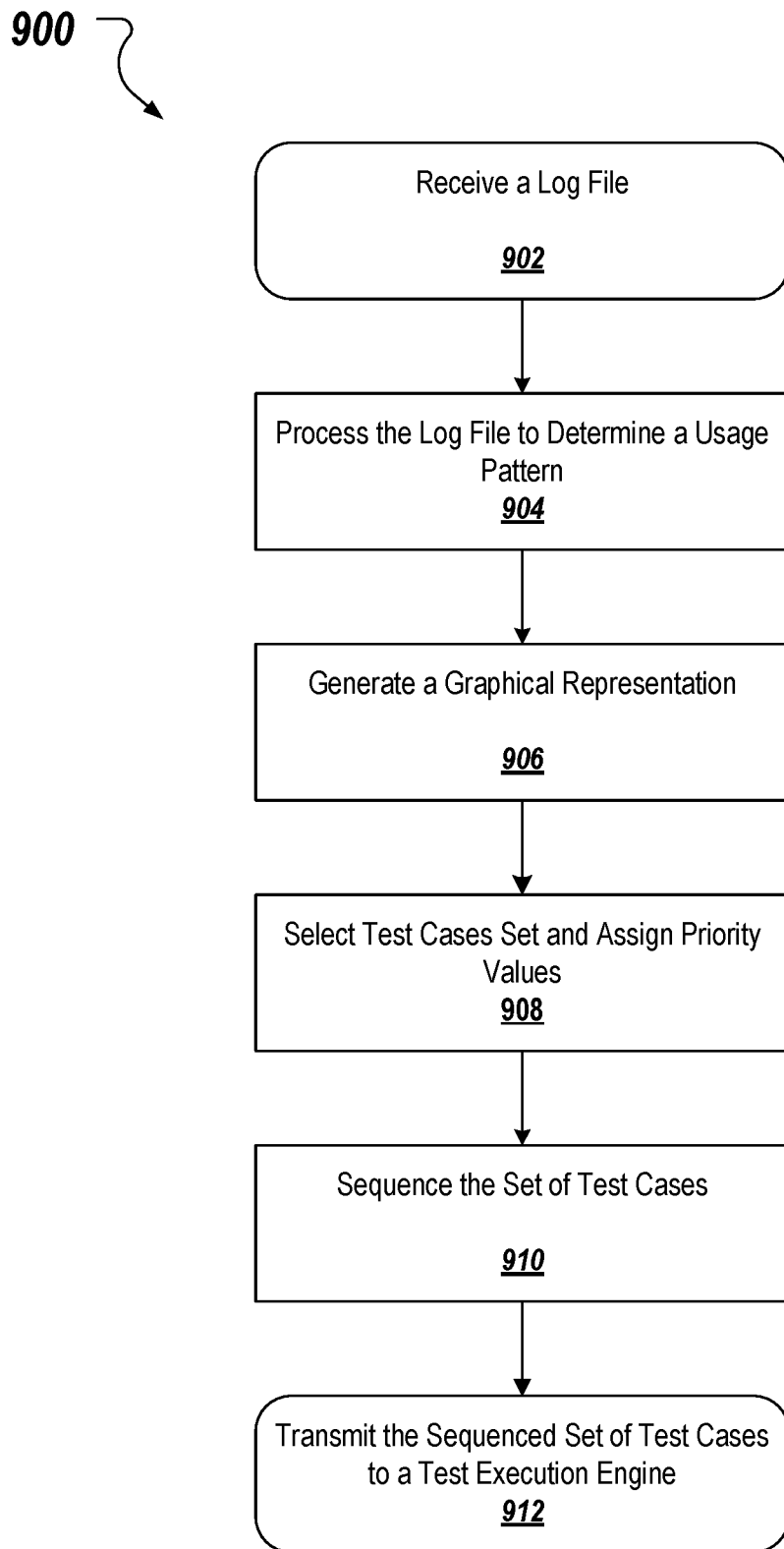
FIGS. 9A-9C depict flow diagrams of an example process employed within a touchless testing platform system.

FIG. 9A depicts a flow diagram of an example process 900 employed within a touchless testing platform system, such as touchless testing platform system 100, to generate a sequenced set of test cases for execution by an execution engine, such as execution engine 140. A log analyzer and pattern miner engine receives (902) a log file that includes log records generated from a code base. The log file is processed (904) by the log analyzer and pattern miner engine through a pattern-mining algorithm to determine a usage pattern. A graphical representation, such as a heat map, is generated (906) by a testing priority generator engine based on an analysis of the usage pattern. A set of test cases is selected (908) and each of the selected test cases is assigned (908) by a dynamic test case selector and sequencer engine by processing the graphical representation through a machine-learning algorithm. The set of test cases is sequenced (910) by the dynamic test case selector and sequencer engine module based on the assigned priority values. The sequenced set of test cases are transmitted (912) to the test execution engine for execution and the process ends.

Figure 9B:
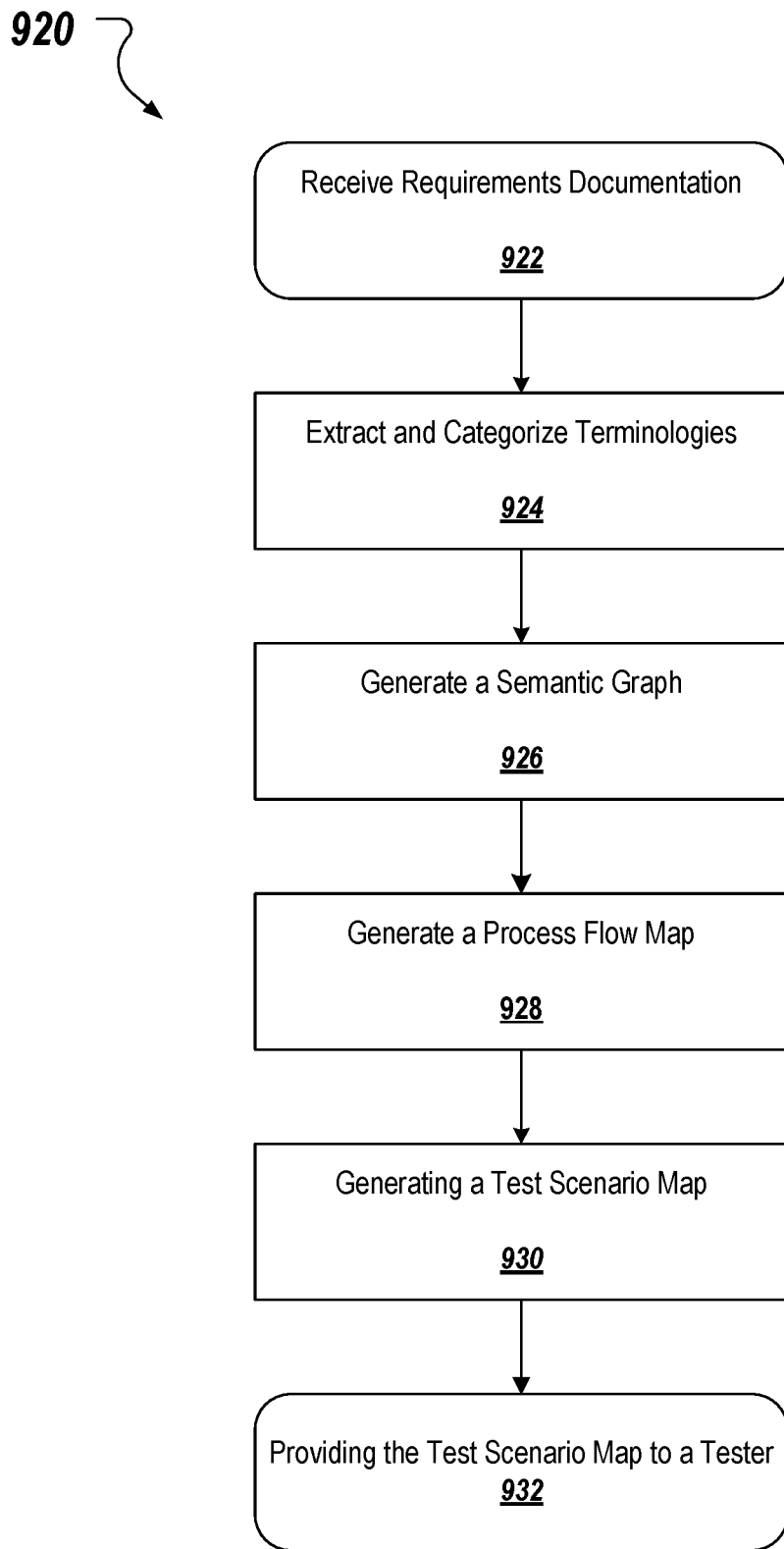

FIG. 9B depicts a flow diagram of an example process 920 employed within a touchless testing platform system, such as touchless testing platform system 100, to provide a test scenario map to a tester, such as user 112, though a UI. A test scenario and process map extractor receives (922) requirements documentation for a respective application or system through a UI. The requirements documentation is analyzed (924) by a terminology module to extract terminologies based on an entity term corpus, which are categorized by a test scenario element classifier based on a corpus of known terms. A semantic graph is generated (926) from standardized statements constructed from the categorized extracted terminologies. A process flow map for the application or system is generated (928) by identifying processes of the application or system and a respective relationship between each process from the semantic graph. A test scenario map of test scenarios for the application is generated (930) from the process flow map and the semantic graph. The test scenario map is provided (932) to a tester through a UI and the process ends.

Figure 9C:
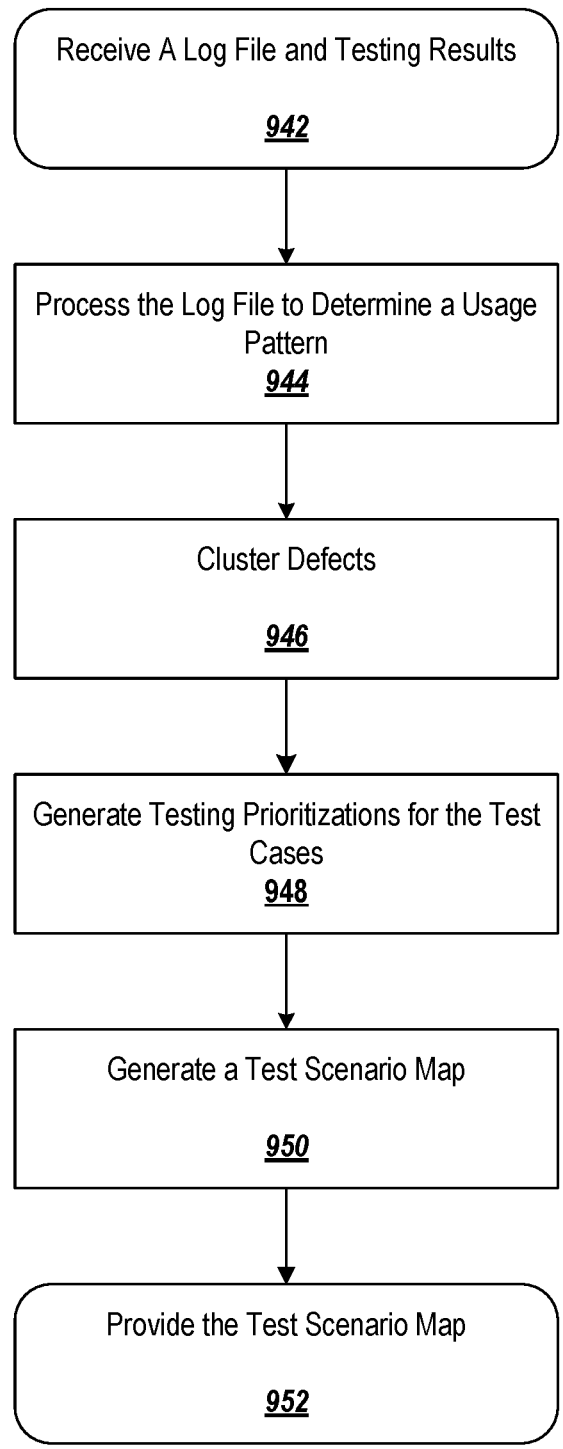

FIG. 9C depicts a flow diagram of an example process 940 employed within a touchless testing platform system, such as touchless testing platform system 100, to provide a sequencing of a set of the test cases to a test execution engine, such as test execution engine 140. A log file and testing results generated from a code base are received (942) through a UI or via a script running on, for example, a server, such as an application, testing, or web server. The log file is processed (944) through a pattern-mining algorithm to determine a usage pattern of code modules within the code base. Defects from the testing results are clustered (946) based on a respective functionality of the application reported within the defect. Testing prioritizations for the test cases are generated (948) by assigning weightages to the test cases based on the clusters of defects and the usage pattern of the code modules. A set of the test cases is sequenced (950) based on the test prioritizations. The sequenced set of test cases is transmitted (952) to a test execution engine and the process ends.

Figure 10:
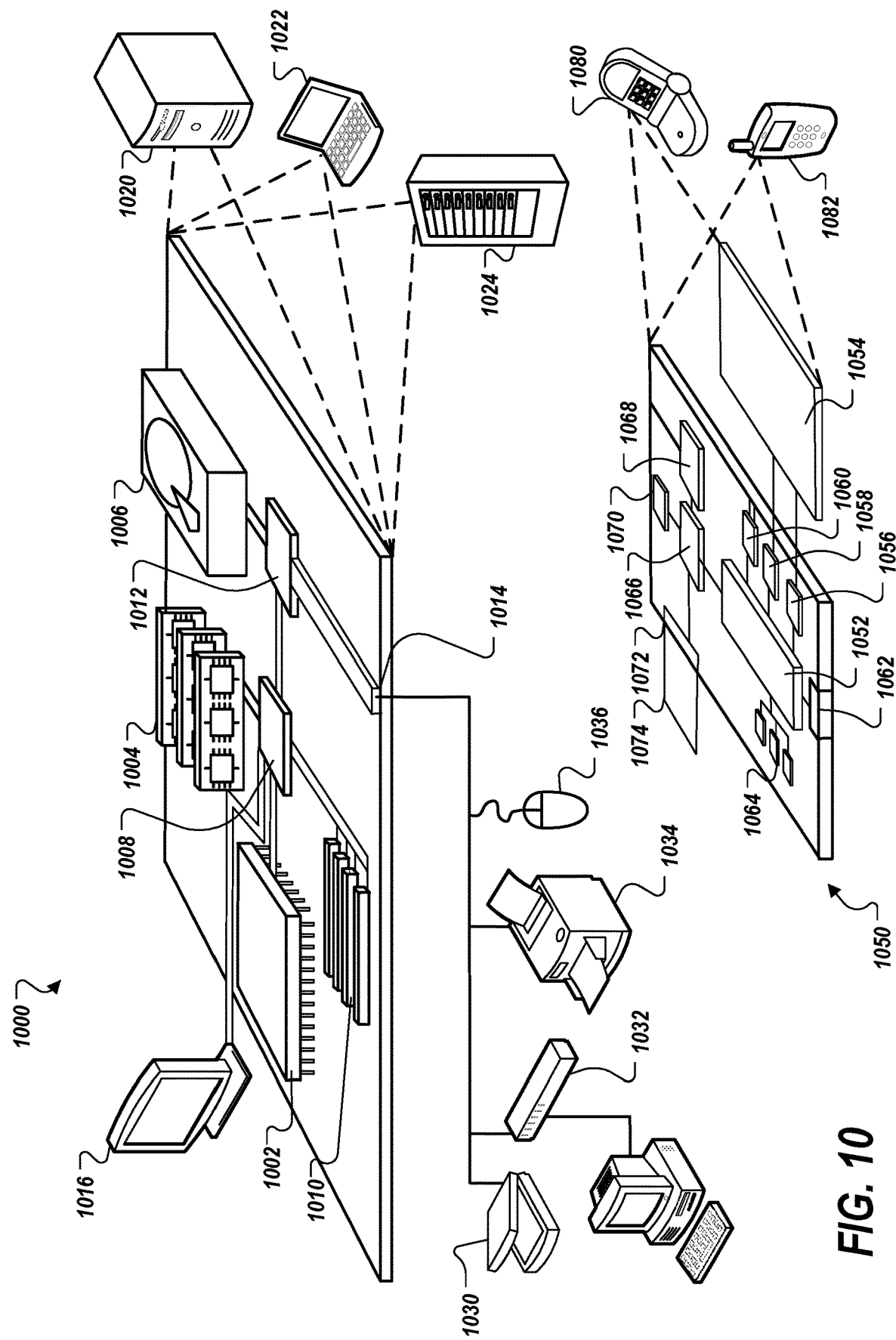
FIG. 10 shows an example of a computing device and a mobile computing device.

FIG. 10 shows an example of a computing device 1200 and a mobile computing device 1250 that can be used to implement the techniques described here. The computing device 1000 is intended to represent various forms of digital computers, such as laptops, desktops, workstations, personal digital assistants, servers, blade servers, mainframes, and other appropriate computers. The mobile computing device 1050 is intended to represent various forms of mobile devices, such as personal digital assistants, cellular telephones, smart-phones, and other similar computing devices. Additionally, computing device 1000 or 1050 can include Universal Serial Bus (USB) flash drives. The USB flash drives may store operating systems and other applications. The USB flash drives can include input/output components, such as a wireless transmitter or USB connector that may be inserted into a USB port of another computing device. The components shown here, their connections and relationships, and their functions, are meant to be examples only, and are not meant to be limiting.

The computing device 1000 includes a processor 1002, a memory 1004, a storage device 1006, a high-speed interface 1008 connecting to the memory 1004 and multiple high-speed expansion ports 1010, and a low-speed interface 1012 connecting to a low-speed expansion port 1014 and the storage device 1006. Each of the processor 1002, the memory 1004, the storage device 1006, the high-speed interface 1008, the high-speed expansion ports 1010, and the low-speed interface 1012, are interconnected using various buses, and may be mounted on a common motherboard or in other manners as appropriate. The processor 1002 can process instructions for execution within the computing device 1000, including instructions stored in the memory 1004 or on the storage device 1006 to display graphical information for a GUI on an external input/output device, such as a display 1016 coupled to the high-speed interface 1008. In other implementations, multiple processors and/or multiple buses may be used, as appropriate, along with multiple memories and types of memory. In addition, multiple computing devices may be connected, with each device providing portions of the necessary operations (e.g., as a server bank, a group of blade servers, or a multi-processor system).

The memory 1004 stores information within the computing device 1000. In some implementations, the memory 1004 is a volatile memory unit or units. In some implementations, the memory 1004 is a non-volatile memory unit or units. The memory 1004 may also be another form of computer-readable medium, such as a magnetic or optical disk.

The storage device 1006 is capable of providing mass storage for the computing device 1000. In some implementations, the storage device 1006 may be or contain a computer-readable medium, such as a floppy disk device, a hard disk device, an optical disk device, or a tape device, a flash memory or other similar solid-state memory device, or an array of devices, including devices in a storage area network or other configurations. Instructions can be stored in an information carrier. The instructions, when executed by one or more processing devices (for example, processor 1002), perform one or more methods, such as those described above. The instructions can also be stored by one or more storage devices such as computer- or machine-readable mediums (for example, the memory 1004, the storage device 1006, or memory on the processor 1002).

The high-speed interface 1008 manages bandwidth-intensive operations for the computing device 1000, while the low-speed interface 1012 manages lower bandwidth-intensive operations. Such allocation of functions is an example only. In some implementations, the high-speed interface 1008 is coupled to the memory 1004, the display 1016 (e.g., through a graphics processor or accelerator), and to the high-speed expansion ports 1010, which may accept various expansion cards. In the implementation, the low-speed interface 1012 is coupled to the storage device 1006 and the low-speed expansion port 1014. The low-speed expansion port 1014, which may include various communication ports (e.g., USB, Bluetooth, Ethernet, wireless Ethernet) may be coupled to one or more input/output devices. Such input/output devices may include a scanner 1030, a printing device 1034, or a keyboard or mouse 1036. The input/output devices may also by coupled to the low-speed expansion port 1014 through a network adapter. Such network input/output devices may include, for example, a switch or router 1032.

The computing device 1000 may be implemented in a number of different forms, as shown in the FIG. 10. For example, it may be implemented as a standard server 1020, or multiple times in a group of such servers. In addition, it may be implemented in a personal computer such as a laptop computer 1022. It may also be implemented as part of a rack server system 1024. Alternatively, components from the computing device 1000 may be combined with other components in a mobile device, such as a mobile computing device 1050. Each of such devices may contain one or more of the computing device 1000 and the mobile computing device 1050, and an entire system may be made up of multiple computing devices communicating with each other.

The mobile computing device 1050 includes a processor 1052, a memory 1064, an input/output device such as a display 1054, a communication interface 1066, and a transceiver 1068, among other components. The mobile computing device 1050 may also be provided with a storage device, such as a micro-drive or other device, to provide additional storage. Each of the processor 1052, the memory 1064, the display 1054, the communication interface 1066, and the transceiver 1068, are interconnected using various buses, and several of the components may be mounted on a common motherboard or in other manners as appropriate.

The processor 1052 can execute instructions within the mobile computing device 1050, including instructions stored in the memory 1064. The processor 1052 may be implemented as a chipset of chips that include separate and multiple analog and digital processors. For example, the processor 1052 may be a Complex Instruction Set Computers (CISC) processor, a Reduced Instruction Set Computer (RISC) processor, or a Minimal Instruction Set Computer (MISC) processor. The processor 1052 may provide, for example, for coordination of the other components of the mobile computing device 1050, such as control of UIs, applications run by the mobile computing device 1050, and wireless communication by the mobile computing device 1050.

The processor 1052 may communicate with a user through a control interface 1058 and a display interface 1056 coupled to the display 1054. The display 1054 may be, for example, a Thin-Film-Transistor Liquid Crystal Display (TFT) display or an Organic Light Emitting Diode (OLED) display, or other appropriate display technology. The display interface 1056 may comprise appropriate circuitry for driving the display 1054 to present graphical and other information to a user. The control interface 1058 may receive commands from a user and convert them for submission to the processor 1052. In addition, an external interface 1062 may provide communication with the processor 1052, so as to enable near area communication of the mobile computing device 1050 with other devices. The external interface 1062 may provide, for example, for wired communication in some implementations, or for wireless communication in other implementations, and multiple interfaces may also be used.

The memory 1064 stores information within the mobile computing device 1050. The memory 1064 can be implemented as one or more of a computer-readable medium or media, a volatile memory unit or units, or a non-volatile memory unit or units. An expansion memory 1074 may also be provided and connected to the mobile computing device 1050 through an expansion interface 1072, which may include, for example, a Single in Line Memory Module (SIMM) card interface. The expansion memory 1074 may provide extra storage space for the mobile computing device 1050, or may also store applications or other information for the mobile computing device 1050. Specifically, the expansion memory 1074 may include instructions to carry out or supplement the processes described above, and may include secure information also. Thus, for example, the expansion memory 1074 may be provided as a security module for the mobile computing device 1050, and may be programmed with instructions that permit secure use of the mobile computing device 1050. In addition, secure applications may be provided via the SIMM cards, along with additional information, such as placing identifying information on the SIMM card in a non-hackable manner.

The memory may include, for example, flash memory and/or non-volatile random access memory (NVRAM), as discussed below. In some implementations, instructions are stored in an information carrier. The instructions, when executed by one or more processing devices (for example, processor 1052), perform one or more methods, such as those described above. The instructions can also be stored by one or more storage devices, such as one or more computer- or machine-readable mediums (for example, the memory 1064, the expansion memory 1074, or memory on the processor 1052). In some implementations, the instructions can be received in a propagated signal, for example, over the transceiver 1068 or the external interface 1062.

The mobile computing device 1050 may communicate wirelessly through the communication interface 1066, which may include digital signal processing circuitry where necessary. The communication interface 1066 may provide for communications under various modes or protocols, such as Global System for Mobile communications (GSM) voice calls, Short Message Service (SMS), Enhanced Messaging Service (EMS), or Multimedia Messaging Service (MMS) messaging, code division multiple access (CDMA), time division multiple access (TDMA), Personal Digital Cellular (PDC), Wideband Code Division Multiple Access (WCDMA), CDMA2000, or General Packet Radio Service (GPRS), among others. Such communication may occur, for example, through the transceiver 1068 using a radio frequency. In addition, short-range communication may occur, such as using a Bluetooth, Wi-Fi, or other such transceivers. In addition, a Global Positioning System (GPS) receiver module 1070 may provide additional navigation- and location-related wireless data to the mobile computing device 1050, which may be used as appropriate by applications running on the mobile computing device 1050.

The mobile computing device 1050 may also communicate audibly using an audio codec 1060, which may receive spoken information from a user and convert it to usable digital information. The audio codec 1060 may likewise generate audible sound for a user, such as through a speaker, e.g., in a handset of the mobile computing device 1050. Such sound may include sound from voice telephone calls, may include recorded sound (e.g., voice messages, music files, etc.) and may also include sound generated by applications operating on the mobile computing device 1050.

The mobile computing device 1050 may be implemented in a number of different forms, as shown in the figure. For example, it may be implemented as a cellular telephone 1080. It may also be implemented as part of a smart-phone, personal digital assistant, or other similar mobile device.

Various implementations of the systems and techniques described here can be realized in digital electronic circuitry, integrated circuitry, specially designed application specific integrated circuits (ASICs), computer hardware, firmware, software, and/or combinations thereof. These various implementations can include implementation in one or more computer programs that are executable and/or interpretable on a programmable system including at least one programmable processor, which may be for a special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural, object-oriented, assembly, and/or machine language. As used herein, the terms machine-readable medium and computer-readable medium refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described here can be implemented on a computer having a display device (e.g., a cathode ray tube (CRT) or liquid crystal display (LCD) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical UI or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. For example, while a client application is described as accessing the delegate(s), in other implementations the delegate(s) may be employed by other applications implemented by one or more processors, such as an application executing on one or more servers. In addition, the logic flows depicted in the figures do not require the particular order shown, or sequential order, to achieve desirable results. In addition, other actions may be provided, or actions may be eliminated, from the described flows, and other components may be added to, or removed from, the described systems. Accordingly, other implementations are within the scope of the following claims.

What is claimed is:

1. A computer-implemented method executed by one or more processors, the method comprising:
   receiving testing results generated from a code base for an application, where the testing results describe defects that occurred during testing of the code base for the application;
   determining semantic similarities between textual descriptions of respective functionality of the application reported within the defects;
   determining code module similarities between code modules of the code base that caused the defects;
   clustering defects from the testing results based on a both the semantic similarities and the code module similarities;
   generating testing prioritizations for test cases for the application based on the clusters of defects and usage data that indicates frequencies that code modules of the code base are used, wherein the testing prioritization prioritizes testing of test cases from different clusters of the defects in accordance with the frequencies that the code modules of the code base that caused the defects are used;
   sequencing a set of the test cases based on the test prioritizations; and
   transmitting the sequenced set of test cases to a test execution engine.

2. The method of claim 1, wherein the usage data comprises a usage pattern of code modules within the code base.

3. The method of claim 2, the usage pattern includes sequences that the code modules were executed and a frequency that each of the sequences were executed.

4. The method of claim 2, comprising:
   generating, based on the usage pattern, a representation of code module execution, a distribution of data across service types, or test case utilization based on actual usages in production.

5. The method of claim 2, comprising:
   mapping the clusters of defects to clusters of test cases to determine test coverage for the code base, wherein priorities are assigned to the test cases based on the mapping and according to the test coverage.

6. The method of claim 5, comprising:
   identifying gaps in test coverage based on the mapping and the determined test coverage.

7. The method of claim 1, wherein the testing prioritizations include a priority for each test case, wherein a priority is assigned to each test case according to the usage data and the associated cluster of defects.

8. The method of claim 1, comprising:
   before generating the testing prioritization, determining lines of code that are exercised by each of the test cases, wherein priorities are assigned to the test cases based on the respective lines of code that are exercised.

9. The method of claim 8, wherein the lines of code exercised by each test case are determined based on execution data from an execution of the test cases against the application captured by an agent installed on an application server that is running the application.

10. The method of claim 1, comprising:
    before generating the testing prioritization, determining user behaviors on the application based on an analysis of a log file, wherein priorities are assigned based on similarity between the respective test case and the determined user behaviors.

11. The method of claim 1, comprising:
    before generating the testing prioritization, processing the testing results to determine an effectiveness metric for each test case, wherein the effectiveness metric indicates an effectiveness of a test case for defect discovery, wherein priorities are assigned to the test cases based on the effectiveness metric.

12. The method of claim 1, wherein the defects are clustered based on semantics generated using text analytics or context generated using knowledge mapping.

13. The method of claim 1, comprising,
    determining churn data based on an analysis of configuration and coding changes to the code base;
    processing testing results, the churn data, and the code base through an Artificial Intelligence (AI) model, the AI model being trained using training data comprising resolutions to the defects in the code base; and
    determining a likelihood of failure for functionalities of the code base, wherein a priority is assigned to the test cases based on the likelihood of failure for the functionalities of the code base.

14. The method of claim 1, comprising:
    determining a resolution for a defect reported based on a result of an execution a testing script assigned to one of the sequenced set of test cases; and
    implementing the resolution in the code base.

15. One or more non-transitory computer-readable storage media coupled to one or more processors and having instructions stored thereon which, when executed by the one or more processors, cause the one or more processors to perform operations comprising:
    receiving testing results generated from a code base for an application, where the testing results describe defects that occurred during testing of the code base for the application;
    determining semantic similarities between textual descriptions of respective functionality of the application reported within the defects;

determining code module similarities between code modules of the code base that caused the defects;

clustering defects from the testing results based on both the semantic similarities and the code module similarities;

generating testing prioritizations for test cases for the application based on the clusters of defects and usage data that indicates frequencies that code modules of the code base are used, wherein the testing prioritization prioritizes testing of test cases from different clusters of the defects in accordance with the frequencies that the code modules of the code base that caused the defects are used;

sequencing a set of the test cases based on the test prioritizations; and transmitting the sequenced set of test cases to a test execution engine.

16. The medium of claim 15, wherein the usage data comprises a usage pattern of code modules within the code base.

17. The medium of claim 15, the usage pattern includes sequences that the code modules were executed and a frequency that each of the sequences were executed.

18. The medium of claim 15, comprising:

generating, based on the usage pattern, a representation of code module execution, a distribution of data across service types, or test case utilization based on actual usages in production.

19. The medium of claim 15, comprising:

mapping the clusters of defects to clusters of test cases to determine test coverage for the code base, wherein priorities are assigned to the test cases based on the mapping and according to the test coverage.

20. A system, comprising:

one or more processors; and a computer-readable storage device coupled to the one or more processors and having instructions stored thereon which, when executed by the one or more processors, cause the one or more processors to perform operations comprising:

receiving testing results generated from a code base for an application, where the testing results describe defects that occurred during testing of the code base for the application;

determining semantic similarities between textual descriptions of respective functionality of the application reported within the defects;

determining code module similarities between code modules of the code base that caused the defects;

clustering defects from the testing results based on both the semantic similarities and the code module similarities;

generating testing prioritizations for test cases for the application based on the clusters of defects and usage data that indicates frequencies that code modules of the code base are used, wherein the testing prioritization prioritizes testing of test cases from different clusters of the defects in accordance with the frequencies that the code modules of the code base that caused the defects are used;

sequencing a set of the test cases based on the test prioritizations; and transmitting the sequenced set of test cases to a test execution engine.

\* \* \* \* \*